United States Patent [19]
Phillips et al.

[11] Patent Number: 5,867,535
[45] Date of Patent: Feb. 2, 1999

[54] COMMON TRANSMIT MODULE FOR A PROGRAMMABLE DIGITAL RADIO

[75] Inventors: William C. Phillips, Ellicott; Michael V. Pascale, Millersville; Ronald W. Minarik, Lutherville; Kenneth M. Schmidt; Benjamin F. Weigand, both of Ellicott; Walter M. Dirndorfer, Linthicum, all of Md.; Robert S. Prill, Allenwood; Arnold B. Siegel, Somerset, both of N.J.

[73] Assignee: Northrop Grumman Corporation, Los Angeles, Calif.

[21] Appl. No.: 522,058

[22] Filed: Aug. 31, 1995

[51] Int. Cl.$^6$ ............................ H04L 27/04; H04L 27/12; H04L 27/20

[52] U.S. Cl. ............................ 375/295; 455/93; 455/118

[58] Field of Search ..................... 375/219, 222, 375/239, 261, 269, 279, 262, 295, 300, 302, 303, 308, 298; 370/204, 206; 455/93, 102, 103, 117, 118, 120; 342/14, 21, 175, 194

[56] References Cited

U.S. PATENT DOCUMENTS

| | | |
|---|---|---|
| 3,130,401 | 4/1964 | Murphy . |
| 3,332,080 | 7/1967 | Verwey . |
| 3,495,248 | 2/1970 | Raether et al. . |
| 3,525,979 | 8/1970 | Kunkel et al. . |
| 3,581,073 | 5/1971 | Visher . |
| 3,946,393 | 3/1976 | Dunne et al. . |
| 3,981,440 | 9/1976 | Richardson . |
| 4,097,922 | 6/1978 | Vito et al. . |
| 4,137,531 | 1/1979 | Pell . |
| 4,215,346 | 7/1980 | Smith, 2nd. ..................... 343/113 R |
| 4,435,711 | 3/1984 | Ho et al. ........................... 343/389 |
| 4,525,865 | 7/1985 | Mears . |
| 4,533,917 | 8/1985 | Reed . |
| 4,658,359 | 4/1987 | Palatucci et al. . |

(List continued on next page.)

FOREIGN PATENT DOCUMENTS

| | | |
|---|---|---|
| 0 170793 | 2/1986 | European Pat. Off. . |
| 0 399200 | 11/1990 | European Pat. Off. . |
| A1 0513443 | 11/1992 | European Pat. Off. . |
| A2 0511511 | 11/1992 | European Pat. Off. . |
| A2 0511730 | 11/1992 | European Pat. Off. . |
| 0 534255 | 3/1993 | European Pat. Off. . |
| 0 553862 | 8/1993 | European Pat. Off. . |
| 95 10889 | 4/1995 | WIPO . |

OTHER PUBLICATIONS

Patent Abstract of Japan, vol. 015, No. 405 (E–1122), 16 Oct. 1991 and Japan 03 165634, 17 Jul. 1991.

Primary Examiner—Jason Chan
Assistant Examiner—Jean B. Corrielus
Attorney, Agent, or Firm—Walter G. Sutcliff

[57] ABSTRACT

A common transmit module of a programmable digital radio has a digital submodule which receives a bit stream and produces a modulated IF signal, and an analog submodule which receives the modulated IF signal and converts the modulated IF signal to a frequency corresponding to a specific type of radio function. The digital submodule includes (a) a sequential/parallel instruction set processor for signal processing and control, (b) a reconfigurable format unit, and (c) a modulator which receives the output signals of the reconfigurable format unit and produces the modulated oscillation signal. The analog submodule includes (a) a tunable local oscillator that produces a tunable local oscillation signal, (b) fixed local oscillators that produce fixed local oscillation signals, and (c) a mixing unit that receives the modulated IF signal, the tunable local oscillation signal and the fixed local oscillation signals, selectively mixes the fixed local oscillation signals with the modulated oscillation signal to produce non-final IF signals, and mixes a non-final IF signal with the tunable local oscillation signal to produce a final converted signal for transmission at the frequency corresponding to the specific type of radio function.

44 Claims, 10 Drawing Sheets

U.S. PATENT DOCUMENTS

| | | |
|---|---|---|
| 4,843,399 | 6/1989 | Bongiorno et al. ................ 342/404 |
| 4,984,295 | 1/1991 | Engstrom et al. . |
| 5,019,910 | 5/1991 | Filmer . |
| 5,052,049 | 9/1991 | Andros et al. . |
| 5,064,927 | 11/1991 | Moore . |
| 5,117,422 | 5/1992 | Hauptschein et al. . |
| 5,144,314 | 9/1992 | Malmberg et al. . |
| 5,165,055 | 11/1992 | Metsler . |
| 5,220,557 | 6/1993 | Kelley . |
| 5,317,316 | 5/1994 | Sturm et al. . |
| 5,323,332 | 6/1994 | Smith et al. . |
| 5,334,982 | 8/1994 | Owen . |
| 5,390,360 | 2/1995 | Scop et al. . |
| 5,471,509 | 11/1995 | Wood et al. . |
| 5,488,356 | 1/1996 | Martinovich et al. . |
| 5,533,072 | 7/1996 | Georgiou et al. . |
| 5,584,051 | 12/1996 | Göken . | ns
COMMON TRANSMIT MODULE FOR A PROGRAMMABLE DIGITAL RADIO

CROSS REFERENCE TO RELATED APPLICATIONS

This application is related to U.S. Applications entitled DIGITALLY PROGRAMMABLE MULTIFUNCTION RADIO SYSTEM ARCHITECTURE, pending and having U.S. Ser. No. 08/522,050; COMMON RECEIVE MODULE FOR A PROGRAMMABLE DIGITAL RADIO SYSTEM, pending and having U.S. Ser. No. 08/528,206 FIR INTERPOLATOR WITH ZERO ORDER HOLD AND FIR-SPLINE INTERPOLATION COMBINATION, and having U.S. Ser. No. 08/522,049, now U.S. Pat. No. 5,732,107; DIGITALLY PROGRAMMABLE RADIO MODULES FOR TRANSPONDER SYSTEMS, pending and having U.S. Ser. No. 08/522,057; and WIDE BAND RADIO-FREQUENCY CONVERTER HAVING MULTIPLE USE OF INTERMEDIATE FREQUENCY TRANSLATORS, having U.S. Ser. No. 08/322,513 and issued as U.S. Pat. No. 5,548,839 on Aug. 20, 1996, which are incorporated by reference herein.

REFERENCE TO MICROFICHE APPENDIX

A microfiche appendix consisting of one fiche and of thirty-four (34) frames is included as part of the specification.

BACKGROUND OF THE INVENTION

1. Field of the Invention

The present invention is directed to a programmable radio which includes a receive module and a transmit module that can be digitally reconfigured to operate over a broad radio band and with different signal formats. More particularly, the present invention is directed to a transmit module of a programmable radio, the transmit module being reprogrammable to transmit different types of radio functions.

2. Description of the Related Art

Many commercial and military situations require radio function for multiple communication, navigation and identification (CNI) functions to be performed at a single location. Such radio function can include radio function for a conventional instrument landing system (ILS), a conventional air traffic control radar beacon system (ATCRBS), a conventional Mode S interrogation system or a conventional VHF AM system. Therefore, there are many air vehicles, ships, space platforms, ground-mobile vehicles, ground-mobile personnel, fixed stations and communication hubs that require multiple radio functions at a single location. An integrated radio system that may perform communication, navigation and identification (CNI) radio functions is used to perform these multiple radio function.

At one extreme, a communication, navigation and identification (CNI) radio system comprises an independent and different-type radio channel for each type of radio function. At the other extreme, an integrated programmable radio system cross-couples various elements of multiple channels, thereby resulting in a highly complex system of tightly coupled resources. Both approaches, and hybrids of the two approaches, have advantages as well as major disadvantages. For example, an independent channel system must have a separate, complete backup system for each critical system. Thus, a complete backup system is typically provided for a critical instrument landing system (ILS). This is very costly. Moreover, cross-coupled systems are extremely difficult to maintain due to difficulties of fault isolation.

Thus, there is a need for improved partitioning of radio system elements that allows the use and reuse of identical common programmable components or modules in a cost effective manner and without costly fault identification. More particularly, there is a need for a radio system having a common transmit module which can be reconfigured to perform different types of radio transmission.

SUMMARY OF THE INVENTION

Accordingly, it is an object of the present invention to provide a programmable transmit module with an architecture that allows maximum flexibility at minimum cost.

It is also an object of the present invention to provide a programmable transmit module which can be reconfigured for different tasks.

A further object of the present invention is to provide a programmable transmit module that accepts a relatively low speed serial bit stream input.

A further object of the present invention is to provide a programmable transmit module which can transmit different types of radio signals over an approximate 2 MHz to 2000 MHz frequency range.

A further object of the present invention is to provide a programmable transmit module which includes a programmable digital submodule and a programmable analog submodule.

A further object of the present invention is to provide a programmable transmit module with internal interconnections between a programmable digital submodule and a programmable analog submodule.

A still further object of the present invention is to provide a programmable transmit module comprising digital and analog circuitry that can be quickly reconfigured for different applications.

A further object of the present invention is to provide a programmable digital submodule including a digital processing portion and a digital-to-analog converter (DAC) portion wherein the programmable digital submodule can accept a typically low speed serial bit stream input and process many different types of information, the digital submodule can place such information on a digital oscillation signal by modulating the oscillation signal with many different forms of modulation in digital format, the information and modulation may be applicable to communication, navigation, identification, radar, telemetry or other radio function signals that are eventually transmitted in free space or in other media, the modulation can include various combinations of amplitude, frequency and phase modulation, and the programmable digital submodule can be quickly reconfigured for different applications.

A further object of the present invention is to provide a programmable digital submodule that has a unique, flexible and functionally efficient digital processing architecture that can process many different types of information and signals in digital format, including analog signals that have previously been converted to digital format, and including communication, navigation, identification, radar, telemetry or other information and signals that are input to the digital submodule in digital format. More specifically, the digital submodule can be quickly reconfigured for different applications, and can provide a unique, flexible and functionally efficient digital processing architecture comprising a combination of functional hardware elements that includes a reconfigurable format unit (such as a field-programmable gate array or arrays, or similar dynamically configurable unit or units), a digital dynamically configurable modulator which includes a numerically controlled oscillator, one or more sequential and/or parallel instruction processors (sometimes referred to as central processing units (CPUs) or even as digital signal processors (DSPs)), random access memory (RAM), nonvolatile (FLASH) memory, dynamically configurable programmable digital filter units (PDFUs), and receivers, transmitters or transceivers for I/O.

A further object of the present invention is to provide a programmable digital submodule that controls the associated radio channel resources. More specifically, the digital submodule controls the associated analog submodule and the transmit resources in an interface unit associated with the channel.

A further object of the present invention is to provide a reconfigurable analog submodule that accepts an analog input signal and produces a similarly modulated radio frequency (RF) oscillation wherein the analog submodule provides the necessary frequency translation (and associated functionality such as tuning, filtering, amplification, etc.) in various stages from the analog signal input to the RF output, the analog signal can be an amplitude, frequency and/or phase modulated analog oscillation or oscillations including analog signals associated with communication, navigation, identification, radar, telemetry or other information, the analog input signal is provided by the associated digital submodule, the analog input signal is at 10 MHz input and the analog submodule produces an output over the approximate 2 to 2000 MHz frequency range, and the analog submodule can be quickly reconfigured for different applications.

A further object of the present invention is to provide a programmable transmit module with programmable external interfaces that can be used for a variety of interface applications, where such interfaces may be serial or parallel, synchronous or asynchronous, bidirectional or unidirectional, to include both standard or custom protocols. Such external interfaces utilize transceivers, receivers or transmitters (i.e., drivers) for differential (i.e., dual rail) connectivity in order to reduce noise pickup.

A further object of the present invention is to provide common identical transmit modules that can easily be reconfigured for many different type CNI radio functions and, as a result, allow reduction in the number of spares or backup modules required for a given level of overall system availability.

A still further object of the present invention is to provide a programmable transmit module having an analog submodule and digital submodule in the same small unit, wherein the relatively noisy digital circuits do not corrupt the sensitive analog circuits, the digital submodule is electrically isolated from the analog submodule to minimize corruption of the relatively noisy digital circuits upon the sensitive analog circuits, the electrical isolation for analog connections between the analog and digital submodules may be achieved via isolation transformers, the analog electrical isolation is preferably located in the analog submodule; however, the analog electrical isolation could be located on the digital submodule.

The electrical isolation for digital connections between the analog and digital submodules is achieved via transceivers, receivers or transmitters (i.e., drivers) located on the analog and the digital submodules for differential (i.e., dual rail) connectivity.

Additionally, it is an object of the present invention to provide a programmable transmit module with programmable external interfaces that can be used for a variety of interface applications. Such interfaces may be unidirectional or bidirectional, serial or parallel, synchronous or asynchronous, and can include both standard and custom protocols. These interfaces can include, for example, a system bus connected to various external equipment (such as computers, displays, audio equipment, monitoring equipment, measuring equipment and control devices such as a keyboard or a touchscreen). The system bus can be separately partitioned into a control/data bus for purposes of control, and into a message bus. A transpond bus can connect the transmit module to an associated receive module for transponder or repeater functions. A transmit bus plus various discretes can be used to control components in an antenna interface unit associated with the same channel as the transmit module. An applique bus can be used to connect the transmit module to an associated applique module to perform additional signal processing beyond the capability of the digital processing portions of the digital submodule. Additional busses can also be used to connect the transmit module to other external elements or modules as provided by the flexible programmable interfaces of the transmit module.

Objects of the present invention are achieved by providing a hardwired transmit module in an optimally partitioned transmission channel which is reprogrammable to transmit radio signals for different types of radio functions. A transmission channel is defined as a channel in which one or more modules in the channel are connected in series and are dedicated or programmed to pass a particular signal or type of information. A hardwired module is defined as a module in which none of the circuit elements are ever used (e.g., switched) in series with circuit elements in another identical module to process a particular signal or flow of information. Therefore, circuit elements of the hardwired transmit module are not used in series with circuit elements of another transmit module to form a transmission channel.

Two separate AM/FM table radios illustrate an example of two separate channels that are each comprised of a single module. Each radio (i.e., "module") can be tuned to receive any number of radio channels (i.e., radio stations), one at a time. However, during normal operation, none of the circuitry in one radio is used in conjunction with circuitry in the other radio. In this case, each radio includes a "hardwired" module. That is, all circuit elements are contained in a box and none of these elements are routinely used in conjunction with the elements in another box. Circuit elements can be switched inside a box for different radio frequency channels or for different radio waveforms, such as AM versus FM. However, the circuit elements are not shared between modules.

Advantages of the present invention over conventional system are that (i) the present invention forms a relatively large portion of a transmission channel, (ii) the transmit module is switched in series with functionally specific antenna interface unit (AIU) modules of relatively small functionality to form a transmission channel, and (iii) the transmit module is programmed to service a considerably wider variety of radio functions than conventional transmission channels.

According to the present invention, when the transmit module is programmed for a specific type of radio function from a wide variety of radio function types, the transmit module receives a serial bit stream representing information to be transmitted, and produces an RF output using the serial bit stream based on the specific type of radio function.

The transmit module includes a digital submodule and an analog submodule. The digital submodule receives the serial bit stream and produces a modulated intermediate frequency signal. The analog submodule receives the modulated intermediate frequency signal and converts the modulated intermediate frequency signal to a frequency corresponding to the specific type of radio function. The digital submodule and the analog submodule are not necessarily hardwired in the sense a module is hardwired, and the term "submodule" is merely used to designate a specific portion of a module.

The digital submodule receives a serial bit stream representing information to be transmitted, and produces a modulated oscillation signal. The digital submodule includes a reconfigurable format unit which is reconfigurable to provide different I/O control and certain highspeed processing functions for transmitting different types of radio functions. The digital submodule also includes a digital modulator which receives the output signals of the reconfigurable format unit and produces the modulated oscillation signal. The reconfigurable format unit produces signals such as an in-phase signal, a quadrature signal, a phase signal and a frequency signal based on the specific type of radio function programmed therein.

The digital submodule also has a digital modulator which includes a numerically controlled oscillator that is responsive to signals such as the frequency, phase and frequency modulation signals produced by the reconfigurable format unit, to produce a digital oscillation signal that represents samples of the desired oscillation signal, potentially with phase and frequency information. The digital submodule also includes an quadrature mixer that is responsive to the in-phase signal and the quadrature signal, to produce the modulated oscillation signal.

The digital submodule also has a sequential/parallel instruction processor (commonly referred to as a central processing unit (CPU) or as a digital signal processor (DSP)) that performs processing functions associated with signal transmission. Depending upon the application, various processing functions may be located in any of the above units.

After the modulated oscillation is generated in digital format, a digital-to-analog (D/A) converter converts the modulated oscillation to an analog signal. In addition, as technology improves, it is anticipated that the D/A conversion process will circumvent the need for one or more mixing stages in the analog submodule.

The analog submodule includes a tunable local oscillator that produces a tunable local oscillation signal; fixed local oscillators that may or may not be derived from the same reference as the tunable local oscillator and that produce respectfully corresponding fixed local oscillation signals; and a mixing unit comprised of frequency translation stages that receives the modulated intermediate frequency signal, the tunable local oscillation signal and the fixed local oscillation signals. The mixing unit selectively mixes the fixed local oscillation signals with the modulated oscillation signal in one or more mixing stages to produce one or more stages of intermediate frequency signals. Then, the mixing unit mixes the final intermediate frequency signal with the tunable local oscillation signal to produce a final frequency translated signal for transmission at the radio frequency (RF) corresponding to the specific type of radio function.

BRIEF DESCRIPTION OF THE DRAWINGS

These and other objects and advantages of the present invention will become apparent and more readily appreciated from the following description of the preferred embodiments, taken in conjunction with the accompanying drawings, of which.

DESCRIPTION OF THE PREFERRED EMBODIMENTS

Figure 1:
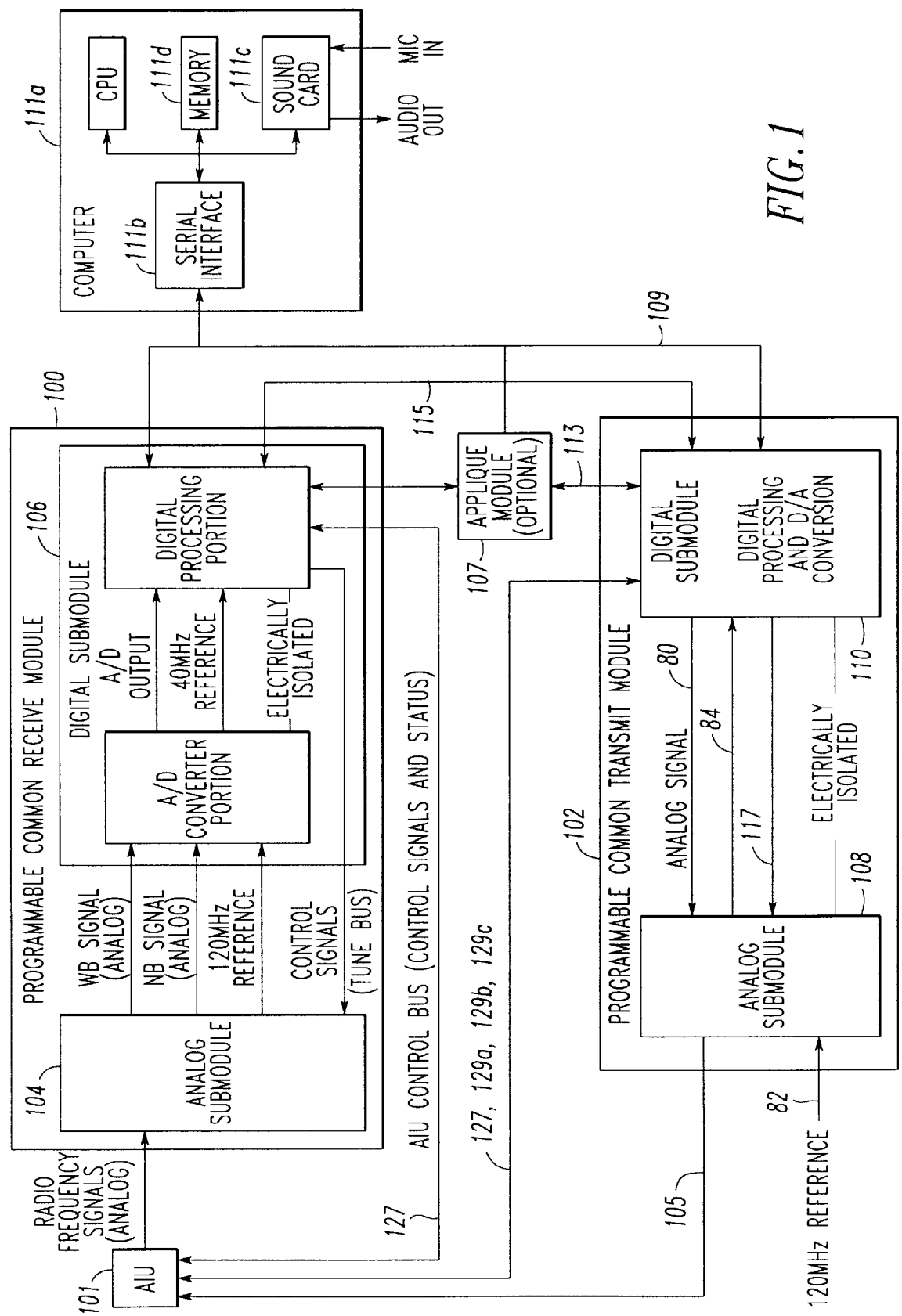
FIG. 1 is a block diagram of a programmable digital radio, according to an embodiment of the present invention.

Reference will be made to the figures, wherein like reference numerals represent similar structures or processes throughout the drawings. FIG. 1 is a block diagram of a programmable digital radio, according to an embodiment of the present invention. More specifically, FIG. 1 illustrates a common receive module 100 and a common transmit module 102 of a programmable digital radio according to an embodiment of the present invention. Common receive module 100 and common transmit module 102 are reprogrammable to receive signals and transmit signals, respectively, for different communication, navigation and identification (CNI) applications. Thus, for example, common transmit module 102 can be programmed to transmit signals in an air traffic control radar beacon system (ATCRBS), and then quickly reprogrammed to transmit signals in a VHF AM system.

Common receive module 100 comprises an analog submodule 104 and a digital submodule 106. Common receive module 100 is described in related disclosure entitled COMMON RECEIVE MODULE FOR A PROGRAMMABLE DIGITAL RADIO, previously mentioned. Thus, a description of common receive module 100 will not be repeated herein.

Common transmit module 102 is partitioned into an analog submodule 108 and a digital submodule 110. Relatively low-speed serial data messages or information signals corresponding to the various communication, navigation and identification (CNI) functions are fed into common transmit module 102. Rare applications may require that relatively high-speed multi-bit processing, such as low probability of intercept/low probability of detection (LPI/LPD), be performed on the received waveform before transmission. These applications use either a special-purpose transmit module similar to a special-purpose receive module, or they employ a separate applique module 107 with a parallel bus interface 113 of moderate speed. Parallel bus interface 113, called an applique interface and hereinafter referred to as "applique interface 113", interfaces applique module 107 to digital submodule 110.

The low-speed data messages or information signals are digitally processed in digital submodule 110 according to the communication, navigation and identification (CNI) configuration programmed therein and converted by digital submodule 110 to an analog signal 80. The analog signal 80 is then frequency translated to the proper RF frequency band within the approximate 2 MHz to 2,000 MHz region in analog submodule 108. A frequency translated signal analog signal 105 is then provided to an appropriate AIU 101 where it undergoes power amplification and filtering, and is routed to the proper antenna (not illustrated) for transmission. Digital submodule 110 uses a transmit control bus 127 and transmit discretes such as 129a, 129b and 129c to send control signals and status information to AIU 101 and to receive status information from AIU 101.

In common transmit module 102, a tune bus 117 is used by digital submodule 110 to send control signals to analog submodule 108. Analog submodule 108 receives a 120 MHz reference signal 82 which is used by a synthesizer (see synthesizer 122 in FIG. 6) for creating local oscillation signals. The 120 MHz reference signal 82 is passed via a coaxial cable 84 to digital submodule 110, where it passes through an isolation transformer (not illustrated) to achieve isolation between the sensitive analog circuits in analog submodule 108 and the digital circuits in digital submodule 110. The 120 MHz signal is then divided by three to obtain a 40 MHz clock signal (not illustrated) for digital submodule 110.

A system bus 109 and a transpond bus 115 connect digital submodule 110 of common transmit module 102 to digital submodule 106 of common receive module 100. A computer 111a is connected to system bus 109 to control common receive module 100 and common transmit module 102. Computer 111a includes a serial interface 111b, a sound card 111c and a memory 111d.

Preferably, digital submodule 110 is completely contained on a single circuit board and analog submodule 108 is completely contained on a different, single circuit board. However, for purposes such as fabrication, testing, etc., analog submodule 108 and digital submodule 110 can also be contained on the same circuit board but with analog and digital portions that are electrically isolated from each other, as described later. Additionally, analog submodule 108 and digital submodule 110 can include multiple, physically separate circuit boards that are properly connected. The term "circuit board" is a general term that can also include other forms of containment, such as chips, application specific integrated circuits (ASICS) and monolithic hybrid packages (MHPs). Therefore, high frequency, low power, noise producing digital circuits can be electrically isolated on digital submodule 110 and shielded from components on analog submodule 108. An electrically conductive shield (not illustrated) and possibly a frame (not illustrated) of a material such as mu-metal is preferably provided between the circuit boards, although the mu-metal frame is sometimes eliminated for reduced size and cost. In addition, the analog signals between the boards are transferred via coaxial cables and are isolated using isolation transformers. To provide further isolation, digital submodule 110 and analog submodule 108 preferably have separate power lines and ground lines to prevent noise and ground loop problems through the power supply. Analog submodule 108 and digital submodule 110 may have their own external connections for power/grounding and digital signals for additional isolation. To prevent noise problems, the digital signals between the boards and to external connections are differential (dual rail) signals. In addition, high speed digital clocks associated with digital circuitry that is necessarily a part of analog submodule 108 and using the analog power source are turned off during signal transmission.

Figure 2A:
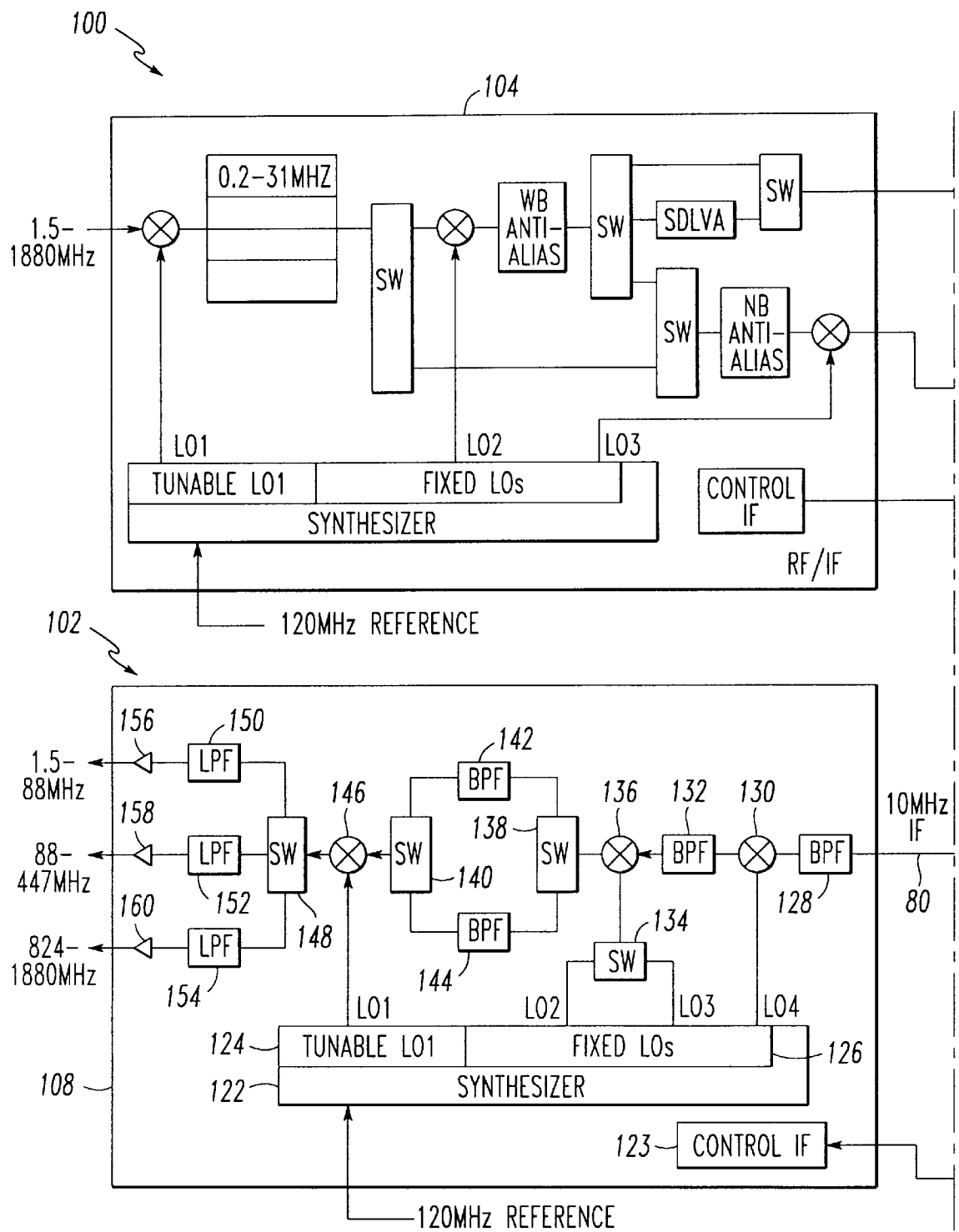
FIG. 2 is a block diagram of a common transmit module, according to an embodiment of the present invention.
Figure 2B:
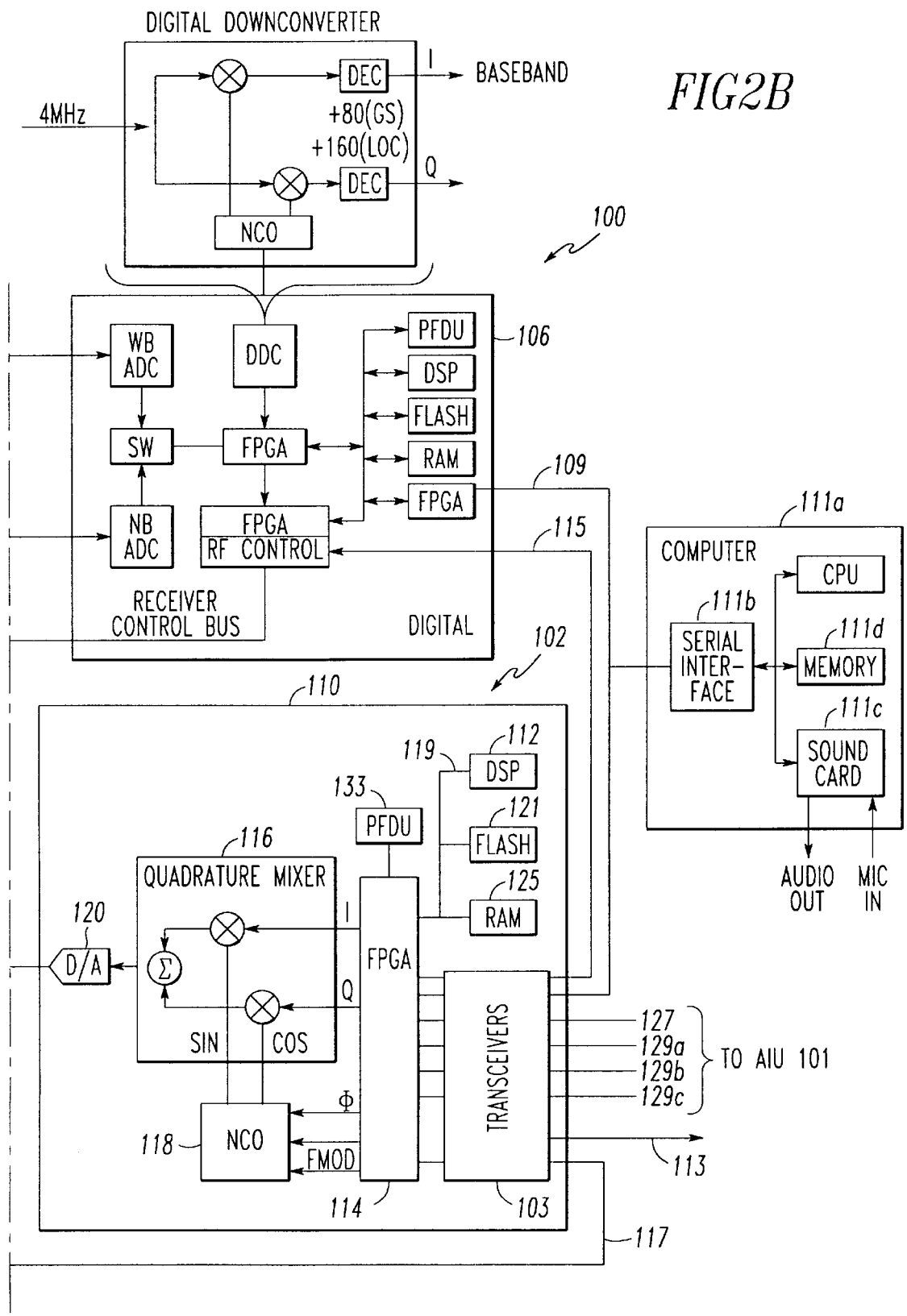
Figure 3:
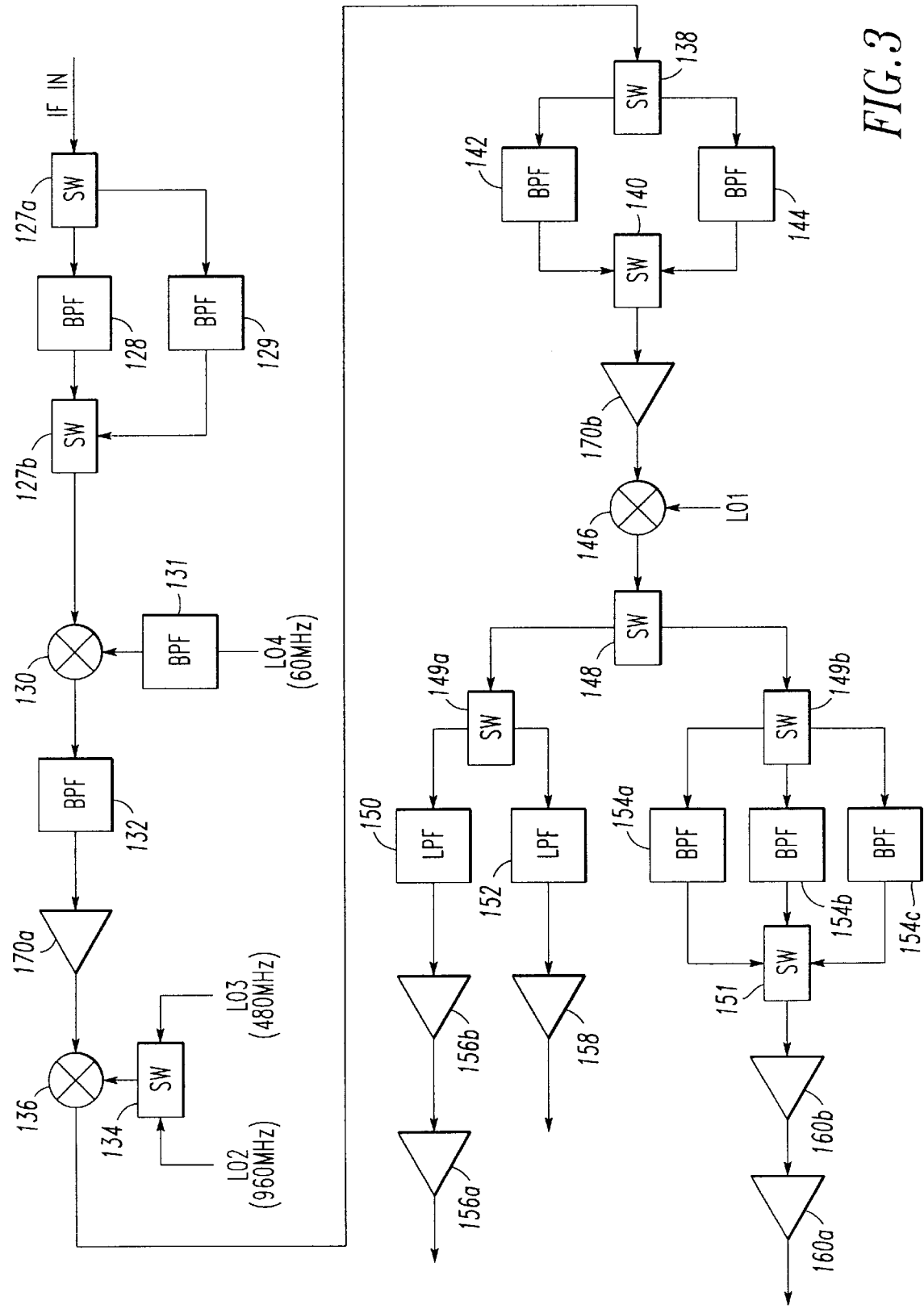
FIG. 3 is a block diagram of an analog submodule of a common transmit module, according to an embodiment of the present invention.

FIG. 2 is a more detailed block diagram of the programmable digital radio illustrated in FIG. 1. The detailed elements of common receive module 100 are discussed in related disclosure COMMON RECEIVE MODULE FOR A PROGRAMMABLE DIGITAL RADIO, previously mentioned. FIG. 2 includes a general illustration of analog submodule 108, and FIG. 3, described more fully later, is a more detailed illustration of analog submodule 108 and includes filters and switches not shown in FIG. 2. Therefore, the following description is directed to FIG. 2; however, various switches and filters in FIG. 3 are also referenced in the description of FIG. 2.

As a general overview of the operation of common transmit module 102, as illustrated in FIG. 2, an information signal in a digital, serial format is received over system bus 109 and reformatted by a conventional field programmable gate array (FPGA) 114 and then provided to a conventional digital signal processor (DSP) 112 of digital submodule 110. As explained in the related disclosure entitled "DIGITALLY PROGRAMMABLE MULTIFUNCTION RADIO SYSTEM ARCHITECTURE, previously mentioned, system bus 109 can be partitioned into separate busses for control and data flow. DSP 112 performs conventional digital signal processing in accordance with the specific communication, navigation or identification (CNI) function programmed therein. For example, if required for a particular application, DSP 112 can be programmed to perform interpolation and baseband arithmetic processing (such as an arithmetic manipulation of the input data stream in accordance with Table II, discussed later) to produce the desired type of modulating signal. In addition, DSP 112 serves as a controller for the elements in digital submodule 110. DSP 112 then transfers the digitally processed information signal to FPGA 114 of digital submodule 110. The term "FPGA" includes multiple, physically separate FPGAs that are interconnected to essentially function as a single, larger FPGA.

FPGA 114 is reconfigurable for specific communication, navigation and identification (CNI) functions by loading data files into FPGA 114, where the data files indicate the desired configuration. Thus, FPGA 114 performs additional signal processing in accordance with the specific communication, navigation or interrogation (CNI) function formatted therein. For example, FPGA 114 can be formatted to perform pulse coded modulation when functioning in an air traffic control radar beacon system (ATCRBS), or interpolation when functioning in a VHF AM system. FPGA 114 is a flexible unit, portions of which can also be internally or externally configured to supply control of analog submodule 108. Such control of analog submodule 108 can include tuning and switching via tune bus 117, control of transmit resources in AIU 101 via transmit control bus 127 or transmit discretes 129a, 129b and 129c, and I/O control with other system units. These control interfaces can be programmed to be serial or parallel, and asynchronous or synchronous as required to include both standard and custom protocols. Since FPGA 114 is reprogrammable for the transmission of different communication, navigation and identification (CNI) functions, FPGA 114 can be referred to as a "reconfigurable format unit" to place the information signal in a format corresponding to the type of radio transmission being performed. Thus, for example, common transmit module 102 is programmable to transmit signals in either an air traffic control radar beacon system (ATCRBS) or a VHF AM system by reformatting FPGA 114 for the particular application.

FPGA 114 can be configured by sending data files representing format data to FPGA 114 over system bus 109 (such as a conventional RS 485 format) from external memory (such as memory 111d of an external computer 111a or memory associated with a communication, navigation and identification (CNI) controller (not illustrated, but described in related disclosure entitled "DIGITALLY PROGRAMMABLE MULTIFUNCTION RADIO SYSTEM ARCHITECTURE")). Thus, in FIG. 2, computer 111a can be considered to be functioning as a communication, navigation and identification (CNI) controller. However, the structure of digital submodule 110 also permits FPGA 114 to be reconfigured in a very short time (for example, 20 milliseconds) to perform a different type of radio function without requiring a change in hardware and the accompanying tests. For example, a conventional non-volatile memory (NVM), such as a programmable flash memory (FLASH) 121, and a conventional random access memory (RAM) 125 are connected to a conventional local bus 119 to allow flash memory 121 and RAM 125 to interact with DSP 112 and FPGA 114. Therefore, as illustrated in FIG. 2, DSP 112 is connected to FPGA 114 via local bus 119. Information is transferred from computer 111a to flash memory 121 and RAM 125 by first transferring information over system bus 109 to FPGA 114. FPGA 114, having a portion which acts as a conventional UART, then transfers the information to local bus 119. Computer 111a then downloads a computer program for programming DSP 112 and data files for formatting FPGA 114 in accordance with the specific type of radio function to be performed, to RAM 125 via local bus 119. In this manner, information corresponding to the different types of radio functions can be stored in RAM 125. This information includes a computer program that runs DSP 112 and data files for configuring FPGA 114.

If desired for a fast response time, such as when the programmable common transmit module is functioning as a spare unit for a failed transmit module associated with a specific radio function, the downloaded program for this radio function, including the FPGA configuration, can be executed immediately. Then, at a convenient time such as when the radio function is in the receive mode, DSP 112 automatically executes a computer program that instructs DSP 112 to copy the information into flash memory 121. When the power to digital submodule 110 is disconnected and then reapplied to digital submodule 110, a boot program instructs DSP 112 to copy the information from flash memory 121, which is non-volatile memory, into RAM 125.

Depending upon the amount of memory available in flash memory 121 and RAM 125, computer programs for DSP 112 and FPGA data files for FPGA 114 corresponding to several radio applications can be downloaded into RAM 125 and copied to flash memory 121. Then, instead of configuring FPGA 114 by sending commands and data files over system bus 109 from computer 111a, FPGA 114 can be configured for a specific type of radio function by instructing DSP 112 over system bus 109 with a brief configuration command to download the application data files from flash memory 121 to RAM 125 and subsequently configure FPGA 114 and DSP 112 with the selected data files prior to executing the application program. Therefore, DSP 112 only needs to receive information over system bus 109 to indicate which type of radio function is intended to be transmitted. As a result, the time to reconfigure FPGA 114 is reduced since data files do not have to be transferred over system bus 109. An example of code for programming common transmit module 102 is attached hereto on microfiche as an appendix. Specifically, the microfiche includes a program which can be loaded into RAM 125 and run by DSP 112 to allow common transmit module 102 to transmit either ATCRBS signals or VHF AM signals.

If the particular application requires that the information signal is "smoothed", DSP 112 performs signal interpolation by digital processing of the samples to increase the number of data points between samples. DSP 112 also performs baseband arithmetic processing or other types of digital signal processing, as required for a particular application. Interpolation and other signal processing can also be performed by FPGA 114. Once a data signal with the desired format and number of data points is produced by passing through DSP 112 and FPGA 114, the data signal is supplied by FPGA 114 to a conventional quadrature mixer 116. Quadrature mixer 116 digitally modulates oscillation signals from a conventional numerically controlled oscillator 118 with the data signals from FPGA 114. The modulated data points are then supplied to a conventional digital to analog converter 120. Digital to analog converter 120 provides an analog output signal to a conventional band pass filter (BPF) 128 of analog submodule 108. BPF 128 may actually be two or more filters (for example, see BPFs 128 and 129 in FIG. 3) in a bank of filters that are switched in accordance with the specific CNI radio function being transmitted. The number of filters in the filter bank can be increased if warranted by the spurious signal spectrum for different radio functions out of digital to analog converter 120.

The signal output by BPF 128 is converted by a conventional first mixer 130. First mixer 130 also receives a local oscillator signal (LO4) from a fixed local oscillator unit 126 that produces a second local oscillator signal LO2, a third local oscillator signal LO3 and fourth local oscillator signal LO4. Depending upon the target radio frequency of the signal, conventional switches 127a (see FIG. 3), 127b (see FIG. 3), 134, 138, 140, 148, 149a (see FIG. 3), 149b (see FIG. 3) and 151 (see FIG. 3) route LO2, LO3, LO4 and the signal through conventional bandpass filters 128 (see FIG. 3), 129 (see FIG. 3), 132, 135a, (see FIG. 6), 135b (see FIG. 6), 142, 144, lowpass filters 150, 152 and 154 (note that lowpass filter 154 is illustrated in FIG. 3 as bandpass filters 154a, 154b and 154c) and conventional mixers 136 and 146. Mixers 136 and 146 convert the signal to the target frequency using oscillator signals from a synthesizer 122.

Furthermore, those of skill in the art can utilize a reconfigurable format unit such as FPGA 114 to adaptively route signals among the various units within digital submodule 110. For example, input signals could be routed first either through DSP 112 for processing (including filtering) or through one or more conventional filter units such as a conventional, optional programmable digital filter unit or units (PDFU) 133. Two such units would be used for filtering both I and Q signal components, and only one such filter would be used, for example, for filtering the combined output of quadrature mixer 116. PDFU 133 (such as Model No. HSP43124, available from Harris Corporation) is an optional unit that could be added to future embodiments in order to provide filtering more efficiently in hardware than can be provided in DSP 112. Model No. HSP43124 is a serial I/O unit that might be employed for size considerations. In this case, FPGA 114 also functions as either a serial-to-parallel converter or as a parallel-to-serial converter depending upon the direction of signal flow. However, a parallel I/O PDFU unit such as in the Harris 43000 series could instead be employed to reduce overall processing delay time.

The unique, flexible and functionally efficient digital processing architecture such as that provided by quadrature mixer 116, numerically controlled oscillator 118, FPGA 114, DSP 112 (e.g., a sequential/parallel instruction processor, CPU or digital signal processor), FLASH memory 121, RAM 125, and PDFU 133, can be programmed by those of skill in the art, particularly with the application notes available with these various units, to perform various processing functions on various type signals, including signals associated with various radio functions. These processing functions can include, for example, interpolation, filtering, oscillation generation, waveform modulation of any combination of amplitude, frequency and phase modulation, pulse width and pulse interval formation, input signal reformatting, fine frequency hopping (coarse frequency hopping is performed in the analog submodule), signal level control, channel control (e.g. gain, signal path switching, tuning) in both digital submodule 110 and analog submodule 108, control of the associated AIU (such as for tuning, switching, modulating or strobing for pulse registration), reply rate limiting, flexible I/O configuration for all interfaces both internal to programmable common transmit module 102 as well as to external units, management/configuration of all programmable common transmit module resources, and BIT control/reporting. Although sometimes performed elsewhere, common transmit module 102, depending upon the processing power implemented, can perform bit stream encoding including such as for error detection and/or correction, message processing including reformatting, network functions, interleaving, processing of low-data rate speech algorithms, and formatting to receive inputs from various external control units. All of these example processing functions as well as other achievable processing functions can be quickly reprogrammed under internal or external control over a wide range of parameters.

Applique interface 113 (illustrated in FIG. 1 but not illustrated in FIG. 2) can interface an optional external applique module 107 (illustrated in FIG. 1 but not illustrated in FIG. 2) directly to D/A converter 120, preferably through FPGA 114 by passing through a conventional transceiver in a conventional transceiver package 103 and possibly through quadrature mixer 116. In some cases, additional processing may be performed by the other processing elements. In other cases, an information signal can be routed from system bus 109, to applique module 107, and then to the transmit module 102. In other cases an information signal from system bus 109 is routed first to transmit module 102 for preprocessing, including reformatting applique module 107 for applique processing, and then back to transmit module 102 for D/A conversion and ultimately transmission at RF. See related disclosure entitled DIGITALLY PROGRAMMABLE MULTIFUNCTION RADIO SYSTEM ARCHITECTURE, previously mentioned, for a discussion of these issues.

Figure 6:
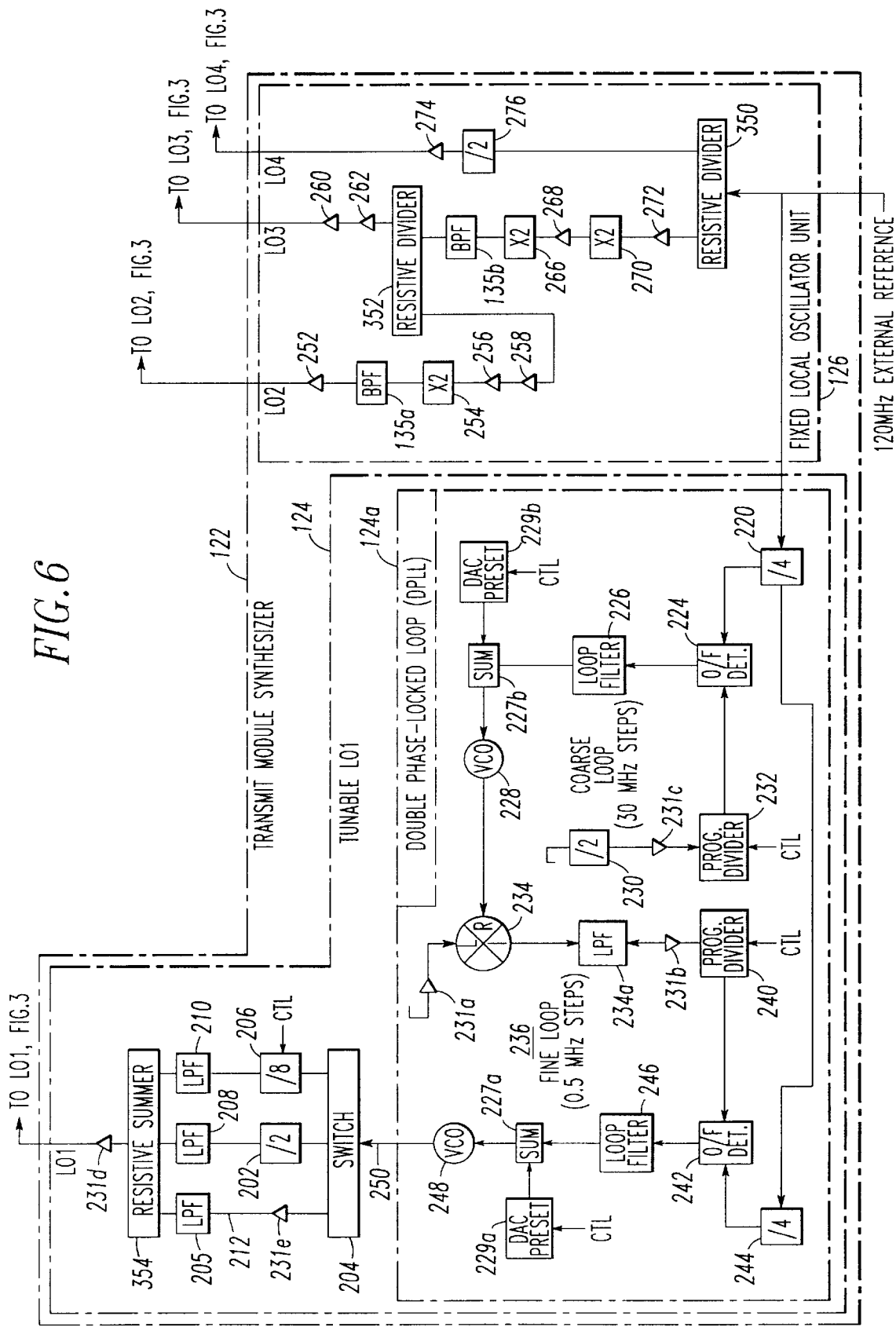
FIG. 6 is a block diagram of a synthesizer/tunable local oscillator, according to an embodiment of the present invention.

Tuning and other frequency conversion operations performed in common transmit module 102 include (i) obtaining, from an external controller or computer 111a via system bus 109, a specific frequency channel number or specific frequency in appropriate units (such as Hertz), as well as other information (such as wideband or narrowband filter select) (ii) arithmetically calculating and, where needed, creating tuning commands in DSP 112 for proportioning of tuning between numerically controlled oscillator 118 and a tunable LO1 124, (iii) reformatting the data in FPGA 114, (iv) passing data to numerically controlled oscillator 118, and (v) passing data to tunable LO1 124 via tune bus 117 whereby a control interface (control IF) 123, based upon the selected frequency band, provides control inputs to programmable dividers 240 and 232 (see FIG. 6) and an output divider select switch 204 (see FIG. 6). Also, based upon the selected frequency band, control interface 123 provides the proper control signals for switches 134, 138, 140, 148, 149a (see FIG. 3), 149b (see FIG. 3) and 151 (see FIG. 3). Moreover, based upon the supplied filter requirements (such as wideband or narrowband), control interface 123 provides the proper control signals for switches 127a (see FIG. 3) and 127b (see FIG. 3).

Similarly, tuning data as well as additional AIU control data received from the external controller or computer 111a (such as transmit signal distribution—e.g., either from an assigned transmit module or a spare transmit module) is processed in DSP 112, reformatted in FPGA 114 and related to the associated AIU via transmit control bus 127 for control of filters, switches, etc. Also, transmit control bus 127 (or a separate bus, if needed for bus traffic consideration) can be used to pass instantaneous modulation information to optimize the operating point, and thus the efficiency, of a power amplifier in the AIU. Commands to the AIU requiring a short time response are processed in DSP 112 and, if necessary, reformatted in FPGA 114 and passed to the AIU via transmit discretes 129a, 129b and 129c. For example, transponder top or bottom antenna selection signals can be sent to an AIU via transmit discrete 129a. Not all of these example transmit discretes are necessarily used for every application, and the flexibility of the design permits FPGA 114 to be programmed for other interfaces, of either discrete functionality, or serial or parallel bus functionality.

The operation of common transmit module 102 is more specifically described below by referring to FIG. 2. Digital submodule 110 includes conventional transceiver package 103, such as Model No. SN75ALS171, available from Texas Instruments. Via transceiver package 103, system bus 109 connects digital submodule 110 to external devices such as conventional computer 111a containing a conventional serial interface 111b, a conventional sound card 111c (such as Model No. Soundblaster 16, available from Creative Labs), and a conventional memory 111d. A conventional microphone (not illustrated) converts voice signals to electrical signals and provides the electrical signals to sound card 111c. Via transceiver package 103, a transpond bus 115 connects digital submodule 110 of common transmit module 102 to digital submodule 106 of common receive module 100. Generally, in a conventional manner, transceiver package 103 convert the voltage level of signals on system bus 109 and transpond bus 115, respectively, to voltage levels required by FPGA 114. Similarly, transceiver package 103 converts voltage levels on applique interface 113 to those required by FPGA 114. Transpond bus 115 is used when transpond functions require transfer of information between common transmit module 102 and common receive module 100. For example, transpond bus 115 is used when common transmit module 102 and common receive module 100 are programmed for a conventional air traffic control radar beacon system (ATCRBS), as disclosed in related disclosure entitled DIGITALLY PROGRAMMABLE RADIO MODULES FOR TRANSPONDER SYSTEMS, previously mentioned. Transpond bus 115 is not used, for example, when common transmit module 102 is programmed for a conventional VHF AM system since a transpond function is not required with VHF AM.

As previously described, DSP 112 loads data files from RAM 125 into FPGA 114 to reconfigure FPGA 114 for the particular application. DSP 112 is a conventional digital signal processor, such as a TMS320 C31 Digital Signal Processor, available from Texas Instruments. Also, as previously described, a portion of FPGA 114 is reconfigured to function as a conventional UART to provide an interface between system bus 109 and FPGA 114. FPGA 114 is a conventional field programmable gate array (FPGA), such as an EPF 81188 Field Programmable Gate Array, available from Altera.

If required for a particular application, such as with VHF AM, FPGA 114 can be reconfigured to perform interpolation on an information signal received over system bus 109. For example, when an input signal is sampled at a rate of 8 KHz with eight bits per sample and is serially transferred to FPGA 114, interpolation by one-thousand (1,000) can be performed to produce a smooth set of samples at an 8 MHz sample rate per second. This reduces the quantization errors caused by the transition between the original 8 KHz samples. DSP 112 is preferably used in conjunction with FPGA 114 to perform interpolation. However, all interpolation can be performed in either DSP 112 or FPGA 114. Certain communication, navigation and identification (CNI) functions, such as air traffic control radar beacon system (ATCRBS), do not require interpolation. Thus, DSP 112 and FPGA 114 do not perform interpolation when common transmit module 102 is configured for such a communication, navigation and identification (CNI) function. There are many different types of conventional interpolation and the present invention is not intended to be limited to any specific type of interpolation.

As previously described, DSP 112 is programmable by downloading a computer program from computer 111a via system bus 109 in a conventional manner. For example, depending on a particular application and the type of modulation, DSP 112 can be programmed in a conventional manner to function as a baseband arithmetic processor (see baseband arithmetic processor 300 in FIG. 9), thereby producing a baseband information modulating signal including an in-phase (I) signal, a quadrature (Q) signal, a phase ($\phi$) signal and a frequency (f) signal in the proper digital format. The frequency signal (f) is illustrated in FIG. 2 as comprising a oscillation frequency component $f_o$ and a frequency modulation component (FMOD) for frequency modulating the oscillation frequency. Thus, DSP 112 is programmable so that common transmit module 102 transmits virtually any type of modulation. Such baseband modulation by a digital signal processor is well-known.

The following Table I illustrates conventional examples of the type of modulation and form of the modulation information for various communication, navigation and identification (CNI) functions, and the following Table II illustrates which of the in-phase, quadrature, phase and frequency signals of DSP 112 are required to transmit various types of modulation. Modulation information is represented by m(t). The amplitude of m(t) can be arithmetically manipulated in baseband arithmetic processor 300 (see FIG. 9) of DSP 112 to produce the desired type of modulation in accordance with Table II, below. In Tables I and II, ASK represents amplitude shift keying, AM represents amplitude modulation, SC represents suppressed carrier, PCM represents pulse coded modulation, PPM represents pulse position modulation, DSB represents double side band, SSB represents single side band, FM represents frequency modulation, PM represents phase modulation, PSK represents phase shift keying, ASK/PSK represents simultaneous amplitude and phase shift keying, MSK represents minimum shift keying, and QM represents quadrature (phase) modulation. ATCRBS, MODE-S interrogate, TACAN, VHF-AM and SATCOM are conventional communication, navigation and identification (CNI) functions.

TABLE I

| FUNCTION | MODULATION | REFERENCE FOR m(t) VALUES |
| --- | --- | --- |
| HF | AM, AM-SC, SSB, FM, FSK, PSK | RTCA/DO-163 plus various commercial and military specs |
| VHF | AM | RTCA/DO-186 plus military specs |
|  | FM | Military SINCGARS specs |
| UHF | AM, FM, FSK | Military Specs |
| UHF SATCOM | PM-QM, FSK | Military Specs |
| EPLRS | MSK derivative | Military Specs |
| Airphone | SSB |  |
| DME/N/P | PPM, shaped PPM | RTCA/DO-189 |
| ATCRBS | PCM | RTCA/DO-181A |
| Mode S | PPM | RTCA/DO-181A |
| TCAS | PPM, PSK | RTCA/DO-185 |
| SATCOM | PM-QM | AMSC MSS-DOC-1021 |
| TACAN* | PCM | Military Specs |
| JTIDS | MSK derivative | Military Specs |

*TACAN pulses may be shaped in the power amplifier in the antenna interface unit (AIU).

TABLE II

| Modulation | I | Q | $\phi$ | f |
| --- | --- | --- | --- | --- |
| AM, ASK | 1 + m(t) | 0 | 0 | $f_o$ |
| AM-SC, PPM | m(t) | 0 | 0 | $f_o$ |
| AM-SC-SSB | m(t) | $\pm m(t)^1$ | 0 | $f_o$ |
| ASK/PSK | $m_1(t)$ | $m_2 t$ | 0 | $f_o$ |
| FM, FSK | 1 | 0 | 0 | $f_o$ + m(t) |
| PM, PSK | 1 | 0 | m(t) | $f_o$ |
| PM-QM | $m_1(t)$ | $m_2(t)$ | 0 | $f_o$ |

In Table II, $m(t)^1$ refers to a ninety degree phase shifted version of m(t). This function is commonly referred to as a Hilbert transform and can be calculated by convolution of m(t) with $1/(\pi t)$. $m_1(t)$ and $m_2(t)$ refer to orthogonal modulation indices. The inclusion of other forms of modulation into Table II, such as MSK, can be made by a person skilled in the art.

As an example, if DSP 112 is programmed to transmit AM modulation, DSP 112 would produce an in-phase (I) signal and a frequency (f) signal, as indicated by Table II. When transmitting VHF AM modulation, DSP 112 is not required to produce a quadrature signal or a phase signal. The production of appropriate in-phase, quadrature, phase or frequency signal from DSP 112, based on the required modulation, is well-known.

The in-phase, quadrature and phase signals produced by DSP 112 are sent to FPGA 114. In FPGA 114 and depending on the particular application in which common transmit module 102 is being used, the in-phase, quadrature and phase signals can be, for example, interpolated or formatted by pulse coded modulation. FPGA 114 also sends a control signal via tune bus 117, which includes a differential clock and a differential serial data stream produced by transceiver package 103, to control interface 123 of analog submodule 100. The control signal controls upconversion variables of analog submodule 100. These upconversion variables are parameters embedded in the DSP programs of each application. Control interface 123 includes transceivers similar to transceiver package 103 plus an electronically programmable logic device (EPLD) (such as Model No. EPLDCY7C342, available from Cypress) which is a synchronous serial interface that accepts the synchronous serial tuning data and formats it into the type of data needed to control programmable dividers 240 and 232 (see FIG. 6), D/A converter presets associated with VCOs 228 and 248 (see FIG. 6), and output divider select switch 204 (see FIG. 6). When based upon the selected frequency band, control interface 123 accepts the synchronous serial tuning data and formats it to the type of data needed to control switches 127a (see FIG. 3), 127b (see FIG. 3), 134, 138, 140, 148, 149a (see FIG. 3), 149b (see FIG. 3) and 151 (see FIG. 3), based upon the supplied filter requirements (such as wideband or narrowband). The upconversion variables are determined by baseband arithmetic processor 300 (see FIG. 9) in DSP 112.

From FPGA 114, the interpolated or formatted signals are sent to conventional quadrature mixer 116, such as a Model No. STEL-1130, available from Stanford Telecom. Similarly, depending on the application, the signals of DSP 112 can be sent to quadrature mixer 116 via FPGA 114 without being interpolated or formatted. In this case, FPGA 114 acts as an interface between DSP 112 and quadrature mixer 116. Via FPGA 114, the frequency signal produced by DSP 112 is received by conventional numerically controlled oscillator 118, such as a STEL-1177 Numerically Controlled Oscillator, available from Stanford Telecom. In response to the frequency signal produced by DSP 112, numerically controlled oscillator 118 acts as a digital local oscillator to produce a sequence of digital samples of the desired oscillation signal. Numerically controlled oscillator 118 also performs phase and frequency modulation of the oscillation. The digital oscillation signal produced by numerically controlled oscillator 118 is received by quadrature mixer 116. Quadrature mixer 116 conventionally generates a digital waveform in accordance with the in-phase, quadrature and phase signals received from FPGA 114, and the digital oscillation signal received from numerically controlled oscillator 118. Thus, the combination of numerically controlled oscillator 118 and quadrature mixer 116 together form a modulator which produces a digitally modulated oscillation signal. In fact, the Stanford Telecom STEL-1130 Quadrature Mixer and the Stanford Telecom STEL-1177 Numerically Controlled Oscillator are typically utilized together to produce digitally modulated oscillation signals in a conventional manner. Thus, the combined operation of quadrature mixer 116 and numerically controlled oscillator 118 is well known. The digital modulated oscillation signal produced by numerically controlled oscillator 118 and quadrature mixer 116 is supplied to conventional digital to analog converter 120, such as a Model No. AD9721, available from Analog Devices. Digital to analog converter 120 receives the digitally modulated oscillation signal and converts the digitally modulated oscillation signal to an analog modulated oscillation signal. The analog modulated oscillation signal represents a first analog intermediate frequency (IF) signal and is provided to analog submodule 108. The intermediate frequency of the analog modulated oscillation signal is preferably at 10 MHz. FPGA 114 also sends a control signal, via tune bus 117, to control interface 123 of analog submodule 102.

Digital to analog converter 120 has sufficient bandwidth (that is, high enough sampling rate) for a considerable number of the widest band communication, navigation and identification (CNI) functions, and has sufficient amplitude resolution for low harmonic content to meet transmitted purity of emission requirements in conjunction with the subsequent filtering in analog submodule 108. Also, with regard to purity of emissions, there are also digital to analog considerations of sampling rate relative to digitized output frequency such that harmonics generated by the digital to analog conversion process in various portions of the ultimate RF output range can be sufficiently attenuated by various filters. These bandwidth and purity of emission considerations help determine the digitized output frequency of digital to analog converter 120.

Once the digital to analog converter 120 output frequency is determined, analog submodule 108 accomplishes the required IF-to-RF conversion with minimal hardware while meeting transmit performance requirements, such as requirements related to signal distortion, harmonics/mixer products, instantaneous bandwidth, oscillator phase noise, and frequency switching speed.

Analog submodule 108 of common transmit module 102 includes a synthesizer 122, a tunable local oscillator (Tunable LO1) 124 which produces a first local oscillator signal LO1, and a series of interconnected fixed local oscillators (fixed LOs) 126 which produce a second local oscillator signal LO2, a third local oscillator signal LO3 and a fourth local oscillator signal LO4. These fixed local oscillators 126 are described in more detail with respect to FIG. 6, described later.

The first analog intermediate frequency signal produced by digital to analog converter 120 is transferred from digital submodule 110 and is received by conventional bandpass filter (BPF) 128. BPF 128 is, for example, a Model No. BPF 6/12 SM, available from Penny Technologies. BPF 128 passes wideband signals at 10 MHz, plus or minus 4 MHz; however, BPF 128 can be a switched bandpass filter bank of filters for wideband and narrowband signals. Thus, instead of being passed through BPF 128, the first analog intermediate frequency signal can be switched through, for example, either a first bandpass filter (not illustrated) which passes wideband signals by passing signals at 10 MHz plus or minus 4 MHz, or a second bandpass filter (not illustrated) which passes narrowband signals by passing signals at 10 MHz plus or minus 0.2 MHz. A conventional first mixer 130 (such as Model No. WJM4T, available from Watkins Johnson) receives the filtered first analog intermediate frequency signal and the fourth local oscillator signal LO4, and produces a corresponding second analog intermediate frequency signal. The second analog intermediate frequency signal is filtered by a conventional bandpass filter (BPF) 132 (such as a Model No. BPF 70 SM, available from Penny Technologies). A conventional switch 134 receives the second local oscillator signal LO2 and the third local oscillator signal LO3, and outputs one of the oscillator signals as a selected oscillator signal. A conventional second mixer 136 (such as Model No. WJM4T, available from Watkins Johnson) receives the selected oscillator signal from switch 134 and the filtered signal from BPF 132, and thereby produces a third analog intermediate frequency. Conventional switches 138 and 140 are controlled to switch the third analog intermediate frequency through either BPF 142 or BPF 144, and then to a third mixer 146, all of which are conventional units. Third mixer 146 also receives the first local oscillator signal LO1 and produces a final frequency signal. Third mixer 146 typically represents the last frequency translation of the transmitted signal. In FIG. 2, the final frequency signal produced by third mixer 146 is switched to either lowpass filter 150, 152 or 154 (note that FIG. 3, discussed later, illustrates of different configuration of the switching and filtering arrangement after third mixer 146. Conventional medium-power amplifiers 156, 158 and 160 provide power amplification of the final frequency signal.

When used in a communication, navigation or interrogation (CNI) system that requires control of antenna interface unit 101, FPGA 114 provides such control signals either over transmit control bus 127 or transmit discretes such as 129*a*, 129*b* and 129*c*. For example, tuning data, as well as additional AIU control data received from the external controller or computer 111*a* is, if necessary, processed in DSP 112, reformatted in FPGA 114 and relayed to the associated AIU via transmit bus 127 for control of filters, switches, etc. Such tuning data and AIU control data can include data relating to transmit signal distribution—e.g., either from the assigned transmit module or a spare transmit module. Also, various commands to the AIU requiring a short time response are, if necessary, processed in DSP 112, reformatted in FPGA 114 and passed to the AIU via discrete lines 129*a*, 129*b* and 129*c*. For example, transponder top or bottom antenna selection is performed via transmit discrete 129*a*, transmit or receive select is performed via transmit discrete 129*b*. Pulse shape strobe for synchronization of modulator pulse output with additional pulse shaping (e.g., for TACAN gaussian pulses) can be performed in the AIU power amplifier. The use of common transmit module 102 in a conventional air traffic control radar beacon system (ATCRBS) requires the use of an antenna interface unit control signal via a transmit discrete 129*a*. The use of common transmit module 102 to transmit signals in an air traffic control radar beacon system (ATCRBS) is more fully described below, and in related disclosure entitled DIGITALLY PROGRAMMABLE RADIO MODULES FOR TRANSPONDER SYSTEMS, previously mentioned.

FIG. 3 is a more detailed block diagram of the signal path of an analog submodule 108 of common transmit module 102, according to an embodiment of the present invention. Thus, FIG. 3 illustrates additional switches and filters which are not illustrated in FIG. 2. More specifically, FIG. 3 illustrates a configuration for producing a transmission signal in the range of 2 MHz to 2000 MHz, thereby allowing common transmit module 102 to transmit different signals corresponding to different communication, navigation and identification (CNI) functions.

As illustrated in FIG. 3, the final frequency signal produced by third mixer 146 is switched by conventional switches 148, 149*a*, 149*b* and 151 to one of conventional lowpass filters (LPFs) 150 and 152, and conventional bandpass filters (BPFS) 154*a*, 154*b* and 154*c* to filter the final frequency signal. Conventional medium-power amplifiers 156*a*, 156*b*, 158, 160*a* and 160*b* are connected to LPFs 150 and 152, and BPFs 154*a*, 154*b* and 154*c* to amplify the filter final frequency signal. Amplifiers 156*a*, 156*b*, 158, 160*a* and 160*b*, LPFs 150 and 152, and BPFs 154*a*, 154*b* and 154*c* are selected in accordance with the output transmission frequency.

In FIG. 3, the various filters and amplifiers are chosen so that the output of amplifier 156*a* is in the approximate range of 1.5–88 MHz, the output of amplifier 158 is in the approximate range of 88 MHz–447 MHz, and the output of amplifier 160*a* is in the approximate range of 824–1880 MHz. The amplified, filtered, final frequency signal at the output of either amplifier 156*a*, 158 or 160 is then routed to AIU 101 where the signal can be further filtered and amplified to a required power level. LPFs 150 and 152, and BPFs 154*a*, 154*b* and 154*c* can be relatively wideband since they are provided mainly to filter out harmonic and other out-of-band interference created as a result of the mixing performed during IF conversion to the oscillation frequency.

As illustrated in FIG. 3, switches (SW) 127*a* and 127*b* are used to select either bandpass filter (BPF) 128 or 129. BPF 128 is used for wider bandwidth CNI functions and BPF 129 is used for narrower bandwidth CNI functions. When switches 127*a* and 127*b* are thrown to select BPF 128, BPF 128 passes frequencies, for example, between a low frequency (FL) equal to or less than 6 MHz and a high frequency (FH) equal to or greater than 14 MHz.

Thus, BPF 128 is centered at 10 MHz and passes signals which are at least plus and minus 4 MHz of the center frequency. Switches 127*a* and 127*b* can also be thrown to select bandpass filter (BPF) 129. BPF 129 is centered on 10 MHz and passes frequencies for narrow band CNI functions. The bandwidth of BPF 129 can be tailored to pass a range of radio channels for various CNI radio functions while rejecting D/A harmonics associated with the generation of the first intermediate frequency associated with those functions. In general, the bandwidth of BPF 129 (or any other filter employed in a switched filter bank at this point) is determined by the fact that the smallest bandwidth of the filter over environmental extremes must be at least as great as the sum of twice the frequency stability of the first intermediate frequency, the bandwidth of the widest bandwidth signal to be passed, the frequency step size of tunable LO1 in the corresponding band of interest and the frequency drift of the filter itself over the environmental extremes. If so desired, additional filters can be added via additional switching, or a variable bandwidth filter can be added, to more finely tailor the filter response to the characteristics of the desired, plus unwanted, signals out of digital to analog converter 120. Also, in an embodiment of the present invention, the output of digital to analog converter 120 can be at 10 MHz when digital to analog converter 120 is sampled at a 40 MHz rate. This operation causes the odd harmonics to fall in the transmitted channel where spurious (i.e., distortion) requirements are the least stringent. However, because tunable LO1 124 has minimum step sizes that are large compared to the channel spacings for some radio functions, channel tuning is accomplished by tuning both LO1 124 and numerically controlled oscillator 118. When tuning numerically controlled oscillator 118, the digital to analog output frequency will be offset from 10 MHz, thereby causing odd D/A harmonics to move in frequency relative to the transmitted channel of interest. If these harmonics do not pass the spurious signal requirements for some radios, it is possible to change the initial offset at 10 MHz (e.g., to 10.25 MHz) such that the initial plus tuned offset always produce low-order odd harmonics that fall outside the narrowband BPF 129, where the design procedure for the bandwidth of BPF 129 is given above.

Moreover, as illustrated in FIG. 3, the final frequency signal produced by third mixer 146 is switched by conventional switches 148, 149*a*, 149*b* and 151 to one of conventional lowpass filters (LPFs) 150 and 152, and conventional bandpass filters (BPFs) 154a, 154b and 154c to filter the final frequency signal. Conventional medium-power amplifiers 156a, 156b, 158, 160a and 160b (each being an amplifier such as Model No. AH-B102D-2, available from TRW) are connected to LPFs 150 and 152, and BPFs 154a, 154b and 154c, as illustrated in FIG. 3, to amplify the filter final frequency signal. Amplifiers 156a, 156b, 158, 160a and 160b, LPFs 150 and 152, and BPFs 154a, 154b and 154c are selected in accordance with the output transmission frequency. Amplifiers 156a, 156b, 158, 160a and 160b are preferably operated well within their linear operating range.

In FIG. 3, the various filters and amplifiers are chosen so that the output of amplifier 156a is in the approximate range of 1.5–88 MHz, the output of amplifier 158 is in the approximate range of 88 MHz–447 MHz, and the output of amplifier 160a is in the approximate range of 824–1880 MHz. The amplified, filtered, final frequency signal at the output of either amplifier 156a, 158 or 160 is then routed to an antenna interface module (not illustrated) where the signal can be further filtered and amplified to a required power level. LPFs 150 and 152, and BPFs 154a, 154b and 154c can be relatively wideband since they are provided mainly to filter out harmonic and other out-of-band interference created as a result of the mixing performed during IF conversion to the oscillation frequency.

Intermediate power amplifiers 156a, 156b, 158 and 160a and 160b are relatively high level amplifiers that maintain a high degree of linearity for the intermediate power signal (e.g., zero milliwatts) that is ultimately passed to the appropriate AIU for higher power amplification. An alternate embodiment eliminates the circuitry following third mixer 146, and passes the output of third mixer 146 directly to the appropriate AIU where only the filtering and intermediate power amplification associated with that AIU need be provided. In this case, additional isolation for this lower level output signal from extraneous signals should be provided.

BPF 132 passes frequencies between a low frequency equal to 65 MHz and a high frequency equal to 75 MHz. BPF 142 passes frequencies between a low frequency equal to 405 MHz and a high frequency equal to 415 MHz. BPF 144 passes frequencies between a low frequency equal to 885 MHz and a high frequency equal to 895 Mhz. Although the bandwidth of these filters are given for illustration purposes, their bandwidth, selectivity, skirt rejection and temporal response are easily selected by those of skill in the art to adequately reject the extraneous signals produced by nonlinearities in various elements such as the mixers and amplifiers that are specifically implemented.

The transmission of signals in the frequency range of 824 MHz to 1880 MHz is switched through one of BPFs 154a, 154b or 154c (which are collectively represented by LPF 154 in FIG. 2). LPF 150 is used for the output frequency range 1.5–88 MHz and passes all frequencies below at least 88 MHz. LPF 152 is used for the output frequency range 88–447 MHz and passes all frequencies below at least 447 MHz. Generally, when they suffice, lowpass filters are used instead of bandpass filters. In addition, lowpass filters are adequate because there are no adverse extraneous signals transmitted in the lower portion of the frequency range. BPF 154a passes frequencies in the range of 824 MHz to 1150 MHz, BPF 154b passes frequencies in the range of 1150 MHz to 1660 MHz, and BPF 154c passes frequencies in the range of 1660 MHz and 1880 MHz. A conventional switch 149a selects either BPF 151 or 152, and a conventional switch 149b selects from among BPFs 154a, 154b and 154c. Conventional amplifiers 170a and 170b are provided to provide adequate signal amplification and conventional amplifiers 156a, 156b, 158, 160a and 160b provide adequate linear signal amplification.

As illustrated in FIG. 3, the second local oscillator signal LO2 is approximately 960 MHz, the third local oscillator signal is approximately 480 MHz and the fourth local oscillator signal is approximately 60 MHz. A BPF 135a filters the second local oscillator signal, a BPF 135b (see FIG. 6) filters the first local oscillator signal and a BPF 131 filters the fourth local oscillator signal. The first local oscillator signal LO1 is a tunable local oscillator signal and is selected from the following Table III in accordance with the desired RF output frequency.

TABLE III

| IF OF THIRD INTERMEDIATE Frequency signal | RF OUTPUT | LO1 | DIVISION RATIO | DPLL | OUTPUT OF SWITCH 134 |
|---|---|---|---|---|---|
| (410) | 1.5–88 | 408.5–322 | 8 | 3268–2576 | 480 |
| (890) | 88–447 | 978–1337 | 2 | 1956–2674 | 960 |
| (410) | 824–1150 | 1234–1560 | 2 | 2468–3120 | 480 |
| (890) | 1150–1660 | 2040–2550 | 1 | 2040–2550 | 960 |
| (410) | 1660–1880 | 2070–2290 | 1 | 2070–2290 | 480 |

In Table III, the DPLL column is the output frequencies of the double phase locked loop illustrated in FIG. 6, described later. The division ratio column indicates a division ratio which divides the DPLL output, thereby producing LO1. The division ratio is selected by output divider select switch 204 (see FIG. 6) and by turning dividers 202 (see FIG. 6) and 206 (see FIG. 6) ON and OFF. As illustrated by Table III, the frequency range of the first local oscillator signal LO1 is 322–2290 MHz. Moreover, the frequency range of the first local oscillator signal LO1 and the oscillator signal selected by switch 134 is readily determinable from Table III and FIG. 3. For example, when the desired RF output is in the range of 1.5 MHz to 88 MHz, as illustrated by Table III, switch 134 selects the third local oscillator signal LO3 (approximately 480 MHz) so that the third intermediate frequency signal output by second mixer 136 has a frequency of approximately 410 MHz. Moreover, the first local oscillator signal LO1 is tuned to be in the range of 408.5 MHz to 322 MHz. Also, with a proper choice of third mixer 146 and the use of straight-through path 212 (see FIG. 6), other combinations for the tuning range of first local oscillator signal LO1 124 and for the third intermediate frequency signal permit an RF output beyond 3500 MHz, albeit with reduced spurious performance at some frequencies.

Therefore, the various switches and dividers in analog submodule 108 are controlled so that the appropriate local oscillator signals and the appropriate BPFs are selected to produce the required final frequency signal.

Figure 4:
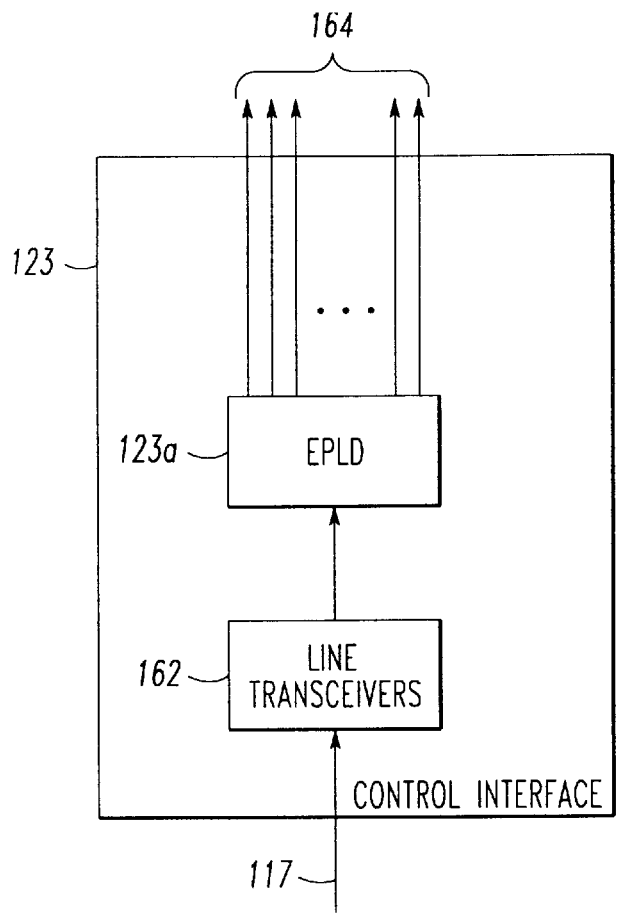
FIG. 4 is a block diagram of a control interface of an analog submodule of a common transmit module, according to an embodiment of the present inventions.

FIG. 4 is a block diagram illustrated control interface 123 of analog submodule 108. As illustrated in FIG. 4, control interface receives control signals from digital submodule 110 via tune bus 117. The control signals on tune bus 117 pass through conventional line transceivers 162 to a conventional electronically programmable logic device (EPLD) 123a in control interface 123. EPLD 123a then produces control signals 164 which are sent to, and control, the various switches, dividers and other control elements, some of which are discussed later, in analog submodule 108. This control of switches using EPLD 123a in control interface 123 is readily understandable by a person skilled in art.

After receiving tuning information from system bus 109 via FPGA 114 and local bus 119, DSP 112 calculates and proportions the tuning between numerically controlled oscillator 118 and the tunable local oscillator LO1 124 in analog submodule 108. DSP 112 uses the tuning information for analog submodule 108 to determine (preferably via a lookup table in RAM 125, but possibly via calculations) the control settings for all the switches in analog submodule 108, programmable dividers 232 and 240 (see FIG. 6), as well as on/off settings for output dividers 202, 206 (see FIG. 6), and output divider select switch 204 (see FIG. 6). In addition, based upon either a tuning versus control voltage estimate or actual calibration data for voltage-controlled oscillators (VCOs) 228 and 234 (see FIG. 6), DSP 112 calculates and determines the digital control inputs to digital-to-analog converters 229a and 229b (see FIG. 6) in order to provide rapid preset tuning voltages for VCOs 228 and 234, and thus rapid tuning for double phase-locked loop synthesizer (DPLL) 124a (see FIG. 6). The implementation of rapid tuning presets for phase-locked loops is well known to those of skill in the art. In addition, settings of any desired level control (not shown) within the RF/IF frequency translator chain based upon an output level measuring circuit (also not shown) is also determined in DSP 112. Control information is passed to FPGA 114, formatted into a serial bit stream and passed through a differential line transceiver in transceiver package 103 to tune bus 117. The information on tune bus 117 is received by control interface 123. The control signals 164 (see FIG. 4) from EPLD 123a of control interface 123 are distributed to the various controlled elements of analog submodule 108. In addition, a separate differential clock signal (not illustrated) for tune bus 117 is also sent from digital submodule 110 to EPLD 123a in analog submodule 108. After passing the information from digital submodule 110 to analog submodule 108 via tune bus 117, the associated differential clock signal is turned off during signal reception to avoid clock contamination of the relatively sensitive analog circuits.

Figure 5:
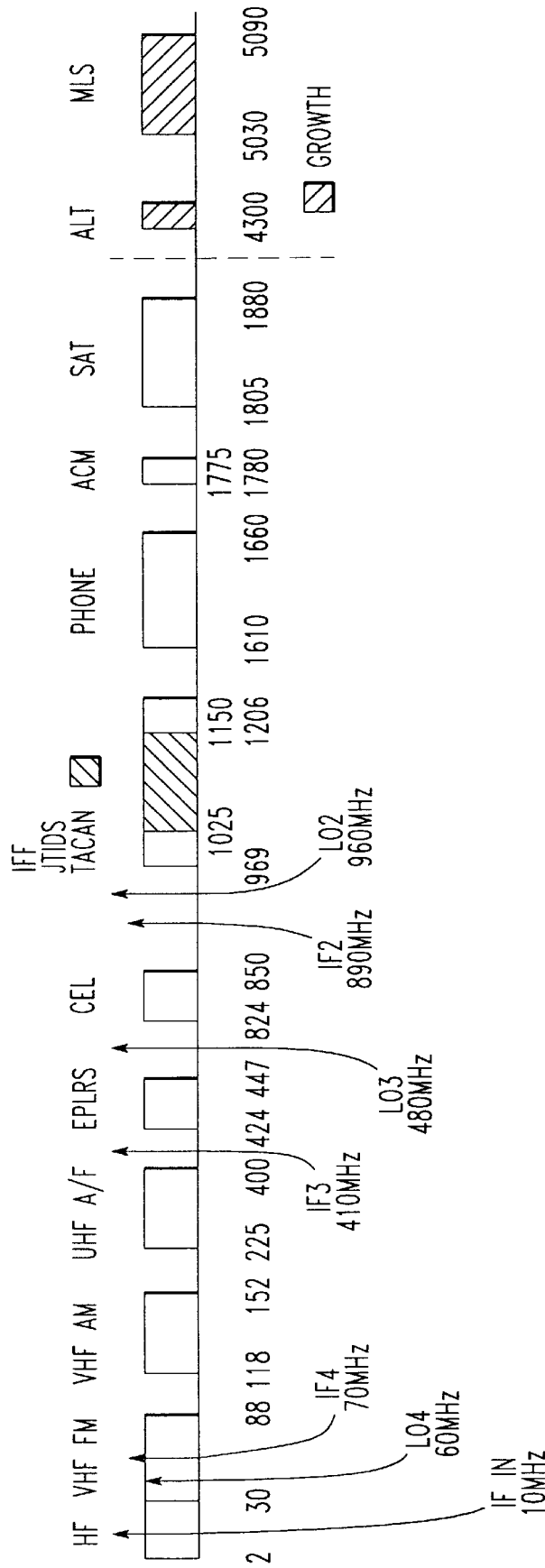
FIG. 5 is a chart illustrating the frequency range allocation for some conventional radio functions that can potentially be provided by the common transmit module, and the frequency of a second local oscillator signal, a third local oscillator signal and a fourth local oscillator signal, as well as associated intermediate frequencies, according to an embodiment of the present invention.

FIG. 5 is a chart illustrating the frequency range allocation for various conventional radio functions, and the frequency of the second local oscillator signal LO2, the third local oscillator signal LO3 and the fourth local oscillator signal LO4. FIG. 5 also illustrates the intermediate frequency (IF IN) of the signal received by BPF 128, the intermediate frequency (IF4) at the output of first mixer 130 based on mixing with LO4, the intermediate frequency (IF3) at the output of second mixer 136 when switch 134 selected LO3, the intermediate frequency (IF2) at the output of second mixer 136 when switch 134 selects LO2. FIG. 5 is useful to persons skilled in the art to design the various mixer stages with proper rejection of extraneous signals of the RF output.

FIG. 6 is a block diagram of a frequency synthesizer 122 within analog submodule 108, according to an embodiment of the present invention. Synthesizer 122 includes tunable LO1 124 for producing LO1, and fixed local oscillators 126 for producing LO2, LO3 and LO4. Tunable local oscillator LO1 124 is a conventional double phaselocked loop synthesizer with conventional output frequency divider circuits 202 and 206, and a straight-through path (i.e., no frequency division) 212. A reference signal of 120 MHz is input to a conventional divide-by-four circuit 220, where the result is compared in a conventional phase-frequency detector 224 to a fed-back signal. It passes through a conventional loop filter 226 to a conventional voltage controlled oscillator 228, where it synchronizes a stronger signal generated by voltage controlled oscillator 228. From voltage controlled oscillator 228, a portion of the signal is passed through a conventional divide-by-two circuit 230 and a conventional programmable divider 232 to supply the fed-back signal. The remainder of the signal from voltage controlled oscillator 228 passes to conventional mixer 234 in fine loop 236, where it is mixed with a portion of the output 250 of DPLL 124a. One sideband is passed through low pass filter 234a to a conventional programmable divider 240, and thence to a conventional phase/frequency detector 242, where it is compared to a signal related to the reference signal after the reference signal is processed by conventional divide-by-four circuits 220 and 244. The result passes through conventional loop filter 246 and synchronizes conventional voltage controlled oscillator 248, to provide an output signal 250 of DPLL 124a. In addition, control signals from EPLD 123a are passed to digital-to-analog converters 229a and 229b which, in turn, sum the control voltages in the return loops for VCOs 228 and 248 in order to provide rapid preset tuning voltages for VCOs 228 and 248, and thus rapid tuning for DPLL 124a.

A conventional switch functions as output divider select switch 204 and is controlled to switch the output signal 250 through frequency divider circuits 202 and 206, or through the straight-through path 212. Signals travelling along the straight-through path 212 and frequency divider circuits 202 and 206 are fed to a conventional resistive summer 354 to produce LO1. FIG. 6 also illustrates various conventional lowpass filters (LPFs) 205, 208 and 210, conventional bandpass filters (BPFs) 135a and 135b, and conventional amplifiers 231a, 231b, 231c, 231d, 231e, 252, 256, 258, 260, 262, 268, 274 and 272.

The second, third and fourth local oscillator signals LO2, LO3 and LO4 are derived from the 120 MHz reference signal. For example, as previously described, the fourth local oscillator signal LO4 is 60 MHz. Thus, the fourth local oscillator signal LO4 is formed by passing the 120 MHz signal through a conventional resistive divider 350 and to a conventional divide-by-two circuit 276. The third local oscillator signal LO3 is 480 MHz and is formed by passing the 120 MHz signal through a multiply-by-four circuit formed by two conventional multiply-by-two circuits 270 and 266. The second local oscillator signal LO2 is 960 MHz and is formed by passing the 120 MHz signal by a multiply-by-eight circuit formed by the two multiply-by-two circuits 270 and 266 and a resistive divider 352 combined with an additional, conventional multiply-by-two circuit 254. Also obvious to persons skilled in the art, summing networks 227a and 227b can be added between loop filter 246 and VCO 248, as well as between loop filter 226 and VCO 228, to sum in predetermined control voltage steps through digital to analog converters 229a and 229b (such as DAC 8228 digital to analog converters, available from Analog Devices) to increase switching speed. Also obvious to persons skilled in the art is the manipulation of various division ratios in the various circuit elements, dependent upon the available programmable division ratios, to reduce step size granularity and reduce phase noise in the coarse and fine loops. In this manner, the second, third and fourth local oscillator signals LO2, LO3 and LO4 are preferably derived from the same reference as the tunable first local oscillator signal LO1.

The selection of frequencies is controlled by FPGA 114, which transmits a control signal to synthesizer 122, via tune bus 117. With this control signal, FPGA 114 instructs synthesizer 122 to tune to the appropriate frequency for the first local oscillator signal LO1. Alternate frequency conversion implementations are also obvious to persons skilled in the art. For example, suitable switching could be added such that the output of BPF 128 could be input directly to third mixer 146, and LO1 suitably tuned to provide a lower delay path for an ATCRBS or Mode S transponder reply at 1090 MHz.

As previously described, referring to FIG. 2, system bus 109 connects digital submodule 110 to external devices such as computer 111a (which includes serial interface 111b and sound card 111c). System bus 109 is a conventional bi-directional serial bus that is formatted for the primary function of passing control and status data, as well as message information data, from a communication, navigation and identification (CNI) controller (not illustrated, but described in related disclosure entitled "DIGITALLY PROGRAMMABLE MULTIFUNCTION RADIO SYSTEM ARCHITECTURE, previously mentioned) to various components, such as digital submodule 110. Normally, system bus 109 handles messages that are relatively brief and aperiodic. Message formatting (but not necessarily the protocol or physical requirements) is similar to well-known MIL-STD 1553, with each complete message or packet passed over system bus 109 prior to the passage of the next message or packet. Messages may include RF or digital signal routing, tuning parameters, built-in-test (BIT) commands and resource configuration. System bus 109 permits the communication, navigation and identification (CNI) controller to receive status information so that appropriate action (display warnings), system automatic reconfiguration, etc. is taken. All of the above functions are performed on one or more busses depending on the bus traffic requirements for the particular application. For example, to handle higher traffic loads, system bus 109 may be split into two separate serial busses (not illustrated), with one serial bus servicing higher rate data of one type format (such as interleaved digitized voice channels) and the other serial bus servicing interleaved aperiodic control data and low-rate periodic data. Longer, higher data rate messages such as multichannel digitized voice, video data and file transfers may require separate message busses, particularly when multiple user terminals are involved. However, depending on the application traffic requirements, a single system bus for smaller applications may download communication, navigation and identification (CNI) module configuration data to the programmable elements, pass data between the communication, navigation and identification (CNI) controller and user terminals, relay brief message packets received or transmitted through the antennas (not illustrated) to and from various system elements, send data to application displays and relay brief message packets among various system elements (including user terminals).

When the time of message transmission is critical with respect to the time of a received message, transpond bus 115 is primarily used for transponder-type functions such as IFF, Mode S and TACAN/transponder. Although not illustrated, transpond bus 115 can also be used to compare data at multiple received channels and to make a quick transmit decision based on such comparison data. Transpond bus 115 is a high speed bus and can be configured to be a serial bus or a parallel bus in accordance with the time available for a transmitted response. Typically, transpond bus 115 has an operating speed of approximately 10 Mbits/sec. Transpond bus 115 can also be used to provide a low-delay intra-net radio relay capability, as described in related disclosure "PROGRAMMABLE DIGITAL MULTIFUNCTION RADIO SYSTEM ARCHITECTURE", previously mentioned.

As previously explained, tune bus 117 connects FPGA 114 to control interface 123 of analog submodule 108 of common transmit module 102, and transmit control bus 127 (as well as additional transmit discretes 129a, 129b and 129c) connect FPGA 114 to a similar control interface of AIU 101 associated with the channel. For VHF AM, tune bus 117 provides tuning control information to programmable dividers 240 and 232, and, as per Table II, selects output division ratio equal to "two" via output divider select switch 204, and selects LPF 150 via switches 148 and 149a. Also, tune bus 117 provides control information to select narrowband BPF 129 via switches 127a and 127b. For VHF AM, transmit control bus 127 may pass control information to AIU 101 for filter tuning and for switch settings for relatively slow antenna selection or for transmit signal distribution (e.g., either from the assigned transmit module or a spare transmit module). Also, for VHF AM, a push-to-talk/activated command can be sent to the AIU to throw a T/R switch either via transmit control bus 127 (if system specifications permit) or via separate transmit discrete 129b. Antenna interface unit built-in test can be initiated by either an antenna interface unit control bus (not illustrated) directly from a system controller (such as computer 111a) or tune bus 117.

Generally, common transmit module 102 is programmed by a communication, navigation and identification (CNI) controller for a specific communication, navigation and identification (CNI) function that is in use at the time. The communication, navigation and identification (CNI) controller is described in more detail in related disclosure entitled "DIGITALLY PROGRAMMABLE MULTIFUNCTION RADIO SYSTEM ARCHITECTURE", previously mentioned. In FIG. 2, computer 111a functions as a communication, navigation and identification (CNI) controller. When one communication, navigation and identification (CNI) function is no longer active and a different communication, navigation and identification (CNI) function is in use, common receive module 100 and common transmit module 102 are reprogrammed by computer 111a for the new application. If two communication, navigation and identification (CNI) functions are simultaneously active, two possibilities arise. First, if appropriate, the two communication, navigation and identification (CNI) functions are time multiplexed through the same programmable channel. Otherwise, two sets of modules are used to provide two channels, with each set programmed to service an assigned function. Furthermore, redundancy can be provided for a wide variety of communication, navigation and identification (CNI) functions via a single programmable common receive module and a single programmable common transmit module, and possibly via fault tolerant AIUs. There is no need to carry additional and different spare channels for each type of communication, navigation and identification (CNI) function.

Figure 7:
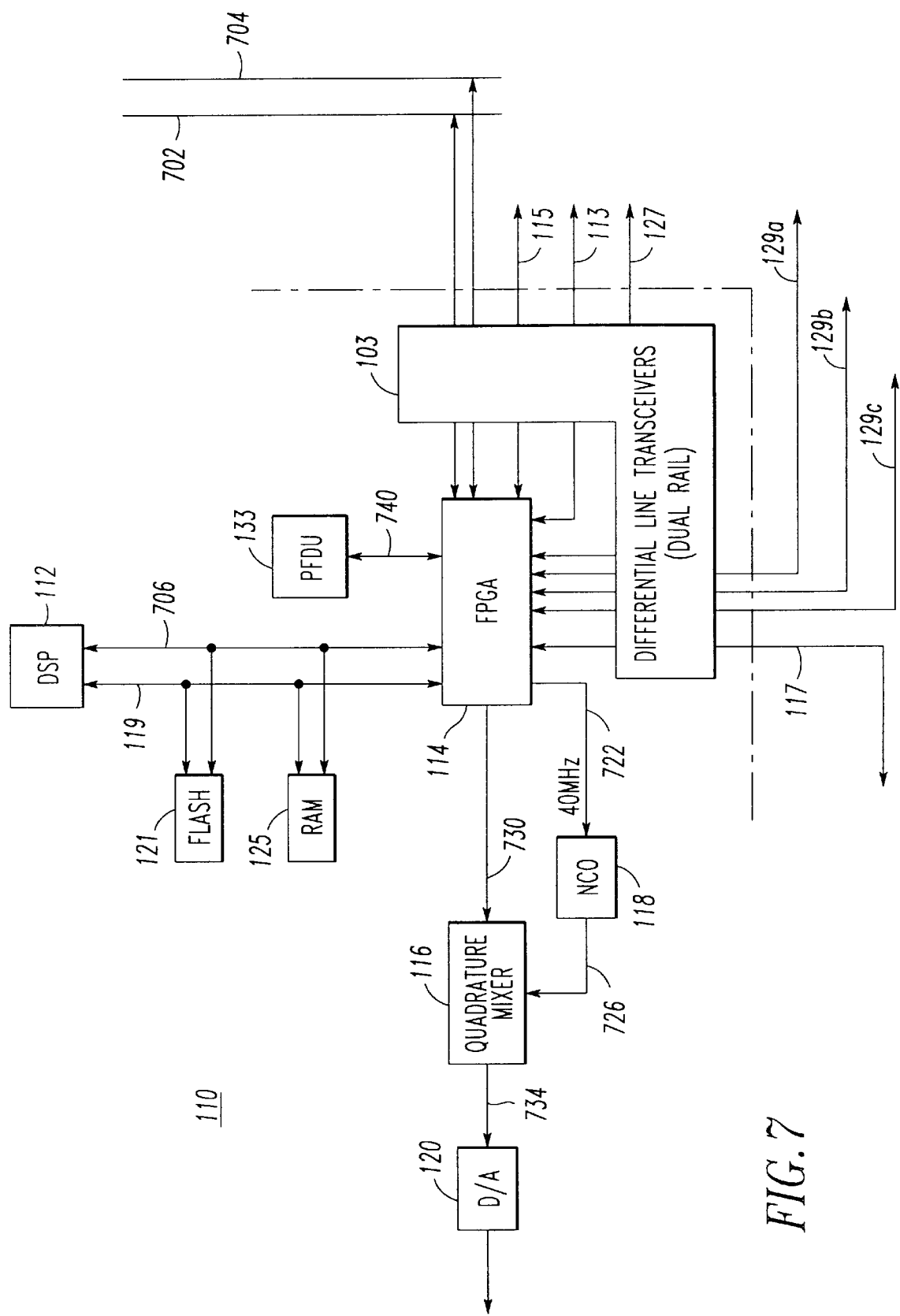
FIG. 7 is a block diagram of a digital submodule of a common transmit module, according to an embodiment of the present invention.

FIG. 7 is a block diagram of a digital submodule of a common transmit module, according to an embodiment of the present invention. In FIG. 7, FPGA 114 is wired to provide a sufficient number of multiple external interfaces (i.e., connections) that can be programmed for any application of common transmit module 102. In FIG. 7, system bus 109 is used to pass both control signals and information and, therefore, is segregated into (a) a separate low-speed serial control/data bus 704 for control and/or information data and (b) a separate low-speed serial message bus 702 used primarily for digital information signals, such as raw data. Segregating system bus 109 into two separate busses permits higher levels of overall bus traffic, and also permits two simpler bus protocols. These simpler bus protocols can be tailored to either control traffic or digital information signal (i.e., message) traffic. As a result, a complex bus protocol is not required for handling a wider variety of traffic types which would be incurred on a single system bus 109.

In the system illustrated in FIG. 7, transceiver package 103 comprises a sufficient number of differential line transceivers to transmit and receive external information on the various interfaces provided by FPGA 114. The differential signals offer noise immunity between the relatively noisy digital circuits in digital submodule 110 and the relatively sensitive analog elements in any transmit channel or receive channel in the overall system. In order to increase input/output flexibility, transceivers are employed for each external interface so that any connection can take place in either direction. However, some transceivers can be replaced with one-way transmitters and/or receivers for size and cost considerations. For example, transmitters can be used for transmit discretes because the associated discrete signals invariably run only to AIU 101 in the associated channel. Provisions for approximately twenty differential line external interfaces should be sufficient for any application of common transmit module 102, particularly since not all types of external connections listed are required for every application and the interconnection wiring between units for the specific system application is wired accordingly.

For example, applique interface 113 and transpond bus 115 are used for a low percentage of radio applications, and these two busses are likely not used in the same application. Also, message bus 702 need not supply the digital information signal input for common transmit module 102 when the digital information signal is supplied by applique interface 113. In addition, if deemed that an external connection should be synchronous, a separate differential line can be assigned as a clock to accompany the external connection.

The various external interfaces to digital submodule 110 are completely programmable in the manner previously described to program digital submodule 110 for various radio functions. That is, external I/O programming and configuration data can be downloaded to RAM 125 from an external unit (for example, computer 111*a*) via, for example, system bus 109 or, if partitioned separately, control/data bus 704. With regard to external connections, I/O configuration data is used to configure FPGA 114 to route digital bit streams to and from each external interconnection utilized. The flow of digital signals with respect to the external interfaces, including the electric formats (bit length, bit rate, etc.) and protocols, are under the control of DSP 112 (that is, a sequential/parallel instruction set processor).

Thus, common transmit module 102 (and particularly digital submodule 110) has programmable external interfaces that can be used for a variety of interface applications, including for both control functions and signal flow. These external interfaces may be serial or parallel, synchronous or asynchronous, unidirectional or bidirectional, and can include both standard or custom protocols. However, it may not be practical at this time to include elements within common transmit module 102 necessary to meet special physical interface requirements for all types of external connections. Such elements may include isolation transformers or drivers to meet voltage levels required by various bus standards. In many cases, such elements are not required, particularly since the external connections run to other system units of the digitally programmable radio system, and the external interfaces and connections of these system units have the same physical definitions. However, where application transformers or drivers of a different line voltage level, or other such elements, are required in a system application, these elements are contained externally in bus interfaces units as described in the related U.S. disclosure entitled DIGITALLY PROGRAMMABLE MULTIFUNCTION RADIO SYSTEM ARCHITECTURE, previously mentioned.

FIG. 7 also illustrates the high-speed interconnections between the various processing elements. For example, in FIG. 7, the following high-speed parallel synchronous busses are illustrated and are clocked to run at 40 MHz: (a) local bus 119, (b) a CPU address bus 706, (c) an amplitude vector modulator bus (that is, quad bus) 730 separately partitioned into in-phase (I) and quadrature (q) portions of twelve bits each, (d) NCO control busses 722 for the phrase, frequency and frequency modulation inputs to the NCO, (e) an NCO output bus 726 separately partitioned into I and Q portions of twelve bits each, and (f) a D/A bus 734. Also, if employed, a filter bus 740 is also a highspeed bus that can be either serial or parallel depending upon PDFU 133 chosen at the discretion of the submodule designer. Another interconnection possibility (not illustrated) is to route D/A bus 734 from quadrature mixer 116 back to FPGA 114, and add an interconnection (not illustrated) from FPGA 114 to D/A converter 120. This enables the output of quadrature mixer 116 to be further processed by another digital submodule element (for example, filtered by PDFU 133) prior to being input to D/A converter 120.

The internal processing described herein that is performed among the various elements in digital submodule 110 is referred to as sampling rate synchronous control processing. This is the processing required to receive a digital information signal from various external units and to condition the digital information signal into a form suitable for modulation by D/A converter 120. The digital information signal may be received from various external units via message bus 702, but also possibly from control data bus 704, or from transpond bus 115 if common transmit module 102 is employed for a transponder or repeater function, or from applique interface 113 if a special processing applique unit is employed to perform signal processing (such as LPI/LPD processing) that is beyond the processing capability of digital submodule 110. An object of the present invention is to contain such sampling rate synchronous control within common transmit module 102 and, in particular, within digital submodule 110. This containment of sampling rate synchronous control simplifies external interconnections among system units by utilizing serial interfaces of as low a speed as possible for the eternal busses (especially message bus 702 or control/data bus 704) of relatively long physical length.

The optional higher-speed parallel transpond bus 115 and applique interface 113, both of which are infrequently used, are of relatively short physical length due to the close proximity of the other system units utilizing these busses. Moreover, transpond bus 115 and applique interface 113, although of higher speeds, are asynchronous to avoid sending a higher speed clock over an interconnection between system modules. Such simplification of external interconnections also reduces electromagnetic interference (EMI) problems and improves the reliability of the physical interconnections among units. Simplified interconnections are particularly important if such system units are of the plug-in variety, where the deterioration of plug-in connectors over time and with usage decreases system reliability and increases EMI.

Also, to further reduce EMI between digital circuitry and the relatively sensitive analog elements in any transmit or receive channel in the overall system, and with respect to any control-type bus that connects digital submodule 110 to such analog elements, clocks that may be associated with such control-type busses are turned off after the passage of the control data is completed. For example, if transmit control bus 127, which provides tuning and/or other control information to AIU 101, is implemented to include a separate differential clock line, the clock is disable after the control information is passed to AIU 101. Similarly, a clock associated with tune bus 117 can be turned off after passing tuning and/or other type of control information from digital submodule 110 to analog submodule 108.

In FIG. 7, transpond bus 115 and applique interface 113 are medium-speed parallel busses. Transmit control bus 127 is a low-speed serial bus, with an optional clock, and is connected to AIU 101. Tune bus 117 is a low-speed serial bus with a clock. Also, in FIG. 7, high-speed signal flow busses are marked as 40 MHz. However, these busses can also run at other clock speeds. Moreover, additional FPGAs can be added and connected to enhance capability.

Figure 8:
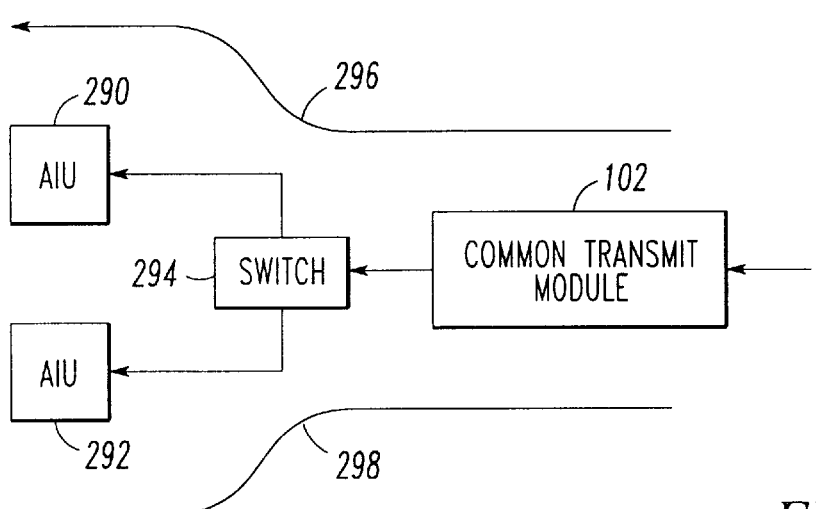
FIG. 8 is a block diagram of a common transmit module configured for use in different channels, according to an embodiment of the present invention.

FIG. 8 is a diagram illustrating the connection of common transmit module 102 to a first antenna interface unit (AIU) 290 and a second antenna interface unit (AIU) 292 through a switch 294, according to an embodiment of the present invention. Common transmit module 102 can be configured as part of a first channel 296 formed by connecting common transmit module 102 to first AIU 290 via switch 294, or as part of a second channel 298 formed by connecting common transmit module 102 to second AIU 292 via switch 294. Thus, common transmit module 102 can be configured to be one of any single channel of a multiple number of channels.

VHF AM

As previously described, common transmit module 102 is reprogrammable to transmit different types of signals corresponding to different types of communication, navigation and identification (CNI) functions. For example, common transmit module 102 can be programmed to transmit signals corresponding to an air traffic control radar beacon system (ATCRBS) or a VHF AM system. Common transmit module 102 is programmed for a specific type of function by, for example, computer 111a loading RAM 125 with a computer program to control DSP 112, appropriate format codes for FPGA 114 and appropriate frequency parameters for numerically controlled oscillator 118. Computer 111a sends the computer program and the format codes to RAM 125 via system bus 109. Thus, to program common transmit module 102 for VHF AM, a computer program for programming DSP 112, format codes for formatting FPGA 114 and frequency parameters for numerically controlled oscillator 118, corresponding to VHF AM, are stored in RAM 125 by computer 111a. DSP 112 then runs the computer program. The computer program causes DSP 112 to read the format codes from RAM 125 and send the format codes to FPGA 114 via local bus 119, thereby formatting FPGA 114. The attached appendix includes a computer program which can be stored in RAM 125 and run by DSP 112 to allow common transmit module 108 to transmit VHF AM signals. Therefore, the computer program in the appendix includes format codes which are transferred by DSP 112 to FPGA 114 in order to format FPGA 114 for VHF AM transmission.

Figure 9:
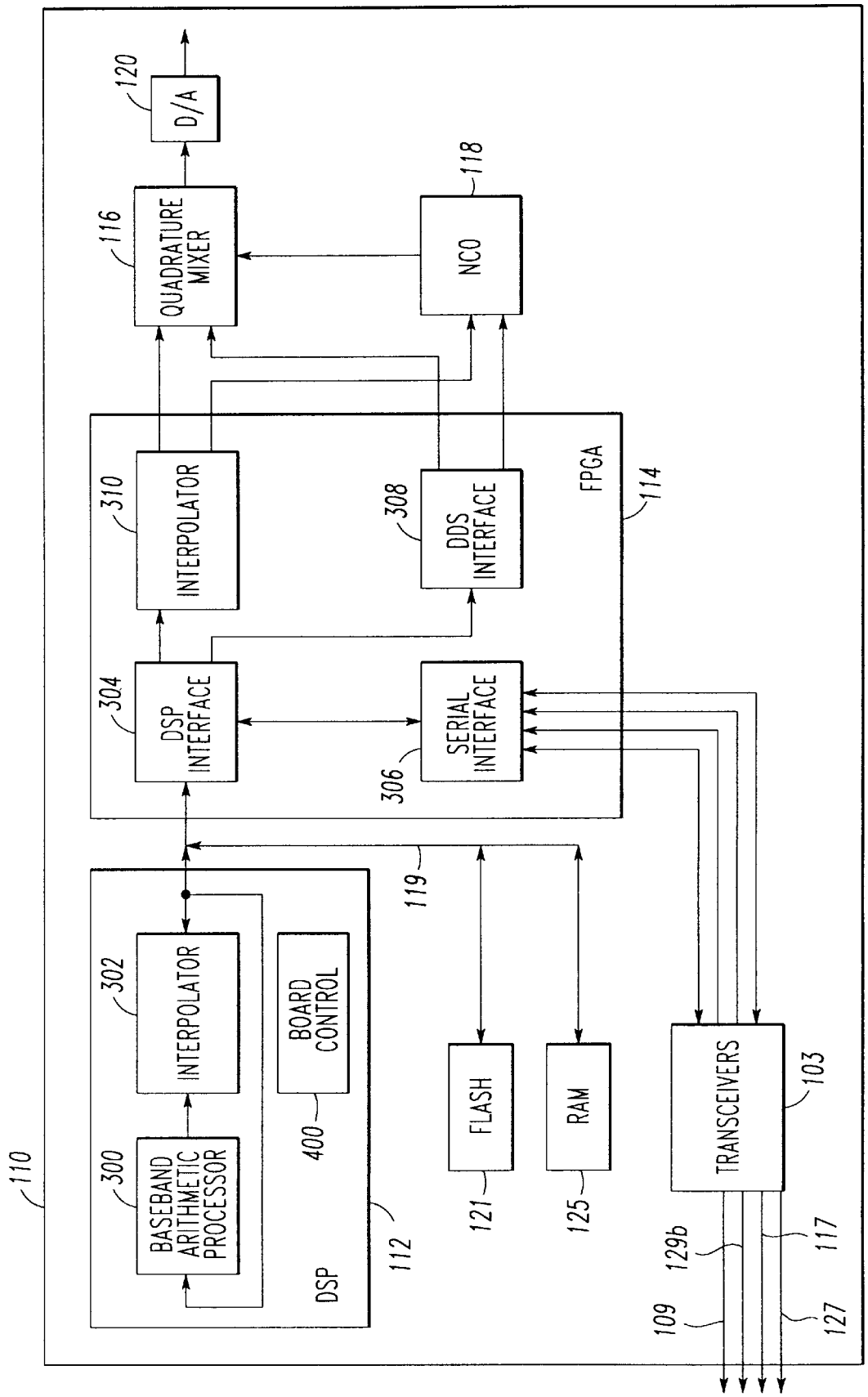
FIG. 9 is a detailed block diagram of a digital submodule programmed for use in a VHF AM system, according to an embodiment of the present invention.

FIG. 9 is a detailed block diagram of digital submodule 110 with FPGA 114 formatted for use in a conventional VHF AM system. As illustrated in FIG. 9, DSP 112 functions as a baseband arithmetic processor 300, as previously described in reference to Table II, to provide the desired arithmetic manipulation of the input data stream for VHF AM. Since VHF AM requires interpolation, DSP 112 also functions as an interpolator 302. DSP 112 performs sequential or parallel instruction processing. FPGA 114 performs the reconfigurable format functions of input/output (I/O) control and high speed processing. FPGA 114 is formatted to simultaneously function as (a) a DSP interface 304 to provide an interface between DSP 112 and FPGA 114 via local bus 119, (b) a serial interface 306 to provide an interface between system bus 109 and FPGA 114, (c) a direct digital synthesis (DDS) interface to provide an interface between FPGA 114 and quadrature mixer 116, and between FPGA 114 and numerically controlled oscillator 118, and (d) an interpolator 310. Serial interface 306 is connected to transceiver package (transceivers) 103. A transceiver in transceiver package 103 generates signals on system bus 109. Another transceiver in transceiver package 103 generates signals on transmit discrete 129b for interfacing with antenna interface units (AIUS) 101. An additional transceiver in transceiver package 103 generates signals on tune bus 117 for interfacing with control interface 123. Similarly, a transceiver in transceiver package 103 generates signals on transmit control bus 127 for interfacing with AIUs. DSP 112 also functions as board control 400, since DSP 112 controls operation of components in digital submodule 110.

Therefore, computer 111a transfers format codes for properly formatting FPGA 114 and a program for controlling DSP 112, into RAM 125 via system bus 109. When DSP 112 runs the computer program, DSP 112 sends the format codes from RAM 125 to FPGA 114 over local bus 119, thereby formatting FPGA 114. The computer program controls DSP 112 so that DSP functions as a conventional baseband processor 300 to perform the required digital signal processing of an information signal for the desired type of transmission, in accordance with Table II, previously discussed. Also, DSP 112 reads frequency parameters for VHF AM stored in RAM 125. The frequency parameters are then transferred via local bus 119 to DSP interface 304, from DSP interface 304 to DDS interface 308, and from DDS interface 308 to numerically controlled oscillator 118 to initialize numerically controlled oscillator 118 to produce numerically controlled oscillations at a specific frequency in accordance with a VHF AM transmission.

Then, numerically controlled oscillator 118 functions as a digital local oscillator to produce a digital oscillation signal in accordance with the frequency parameters read from RAM 125 by DSP 112 and sent by DSP 112 to numerically controlled oscillator 118. With VHF AM, a voice signal is converted into an analog electrical signal by a microphone (not illustrated). The analog electrical signal is then digitized by sound card 111c, thereby producing a digitized voice signal on system bus 109. The digitized voice signal is transferred from sound card 111c through the serial interface 111b to serial interface 306 of FPGA 114 via system bus 109 and transceiver package 103. In a conventional manner, serial interface 306 converts the digitized voice signal to an appropriate format and sends the digitized voice signal to DSP interface 304. DSP interface 304 functions as an interface with DSP 112 to send the digitized voice signal to baseband arithmetic processor 300 of DSP 112. Baseband arithmetic processor 300 then manipulates the digitized voice signal to create the modulating signal in accordance with the VHF AM requirements listed in Table II.

The digitized voice signal must also be interpolated. There are many forms of interpolation and, depending on a particular application, interpolation does not have to be performed in both DSP 112 and FPGA 114, and can instead be performed in either DSP 112 or FPGA 114. Related disclosure entitled FIR INTERPOLATOR WITH ZERO ORDER HOLD AND FIR-SPLINE INTERPOLATION COMBINATION, previously mention, discloses an advanced interpolation technique which effectively uses processing power of DSP 112 by first interpolating an information signal by eight in DSP 112 with FIR interpolation, and then further interpolating with Spline interpolation in FPGA 114 by one-hundred and twenty-five (125). With VHF AM, only the in-phase signal is of interest, as is well-known. DSP 112 is preferably used in conjunction with FPGA 114 to perform interpolation, but all interpolation can be performed in a conventional manner in either DSP 112 or FPGA 114. There are many different types of interpolation and the present invention is not intended to be limited to any specific type of interpolation.

Therefore, after being manipulated by baseband arithmetic processor 300, the in-phase signal of the digitized voice signal is interpolated by interpolator 302 of DSP 112. After interpolation, the signal is transferred back to DSP interface 304 of FPGA 114. DSP interface 304 functions as an interface between DSP 112 and FPGA 114 to send the interpolated in-phase signal to interpolator 310 of FPGA 114 where the in-phase signal is further interpolated. An interpolated in-phase signal produced by interpolator 310 is provided to quadrature mixer 116. The quadrature, phase and frequency signals are not used in VHF AM.

Quadrature mixer 116 mixes the digital oscillation signal from numerically controlled oscillator 118 with the interpolated in-phase signal produced by interpolator 118, thereby producing a digitally modulated oscillation signal. The digital amplitude modulated oscillation signal is supplied to digital to analog converter 120. Digital to analog converter 120 receives the digitally modulated oscillation signal and converts the digitally modulated oscillation signal to an analog amplitude modulated oscillation signal. The analog modulated oscillation signal represents a first analog intermediate frequency (IF) signal and is provided to analog submodule 108. The intermediate frequency of the analog modulated oscillation signal is preferably at 10 MHz. FPGA 114 also sends a control signal, via tune bus 117, to control interface 123 of analog submodule 102.

Control interface 123 controls switches 127a, 127b, 134, 138, 140, 148, 149a, 149b and 151 so that the analog modulated oscillation signal is properly routed through analog submodule 108. Control interface 123 also commands tunable LO1 124 to the proper frequency by setting the DPLL frequency via programmable dividers 232 and 240 and by selecting the proper division ratios 202, 206 or 212 via output divider select switch 204. The first analog intermediate frequency signal produced by digital to analog converter 120, at 10 MHz, is serially transferred from digital submodule 110 and is received by BPF 128. BPF 128 passes wideband signals at 10 MHz, plus or minus 4 MHz. BPF 128 is a filter having a passband response which is sufficiently wide to pass all CNI radio functions of interest. However, for VHF AM, a BPF with a narrower passband response can be employed. After passing through BPF 128, the first intermediate frequency signal is mixed by first mixer 130 with the fourth local oscillator signal LO4 (60 MHz) to produce the second analog intermediate frequency signal at approximately 70 MHz. The second intermediate frequency signal passes through BPF 132 centered at 70 MHz, is amplified by amplifier 170a and is received by second mixer 136. Since VHF AM signals must be transmitted within the frequency range of 118 MHz to 152 MHz, Table III indicates that switch 134 is controlled to select LO2 (960 MHz). Thus, second mixer 136 mixes the second intermediate frequency signal with the second local oscillator signal LO4, to produce the third intermediate frequency signal at approximately 890 MHz. Switches 138 and 140 are controlled to allow the third intermediate frequency signal to pass through BPF 144 centered at approximately 890 MHz. After passing through BPF 144, the third intermediate frequency signal is amplified by amplifier 170b and is received by third mixer 146. As indicated by Table III for RF output in the range of 88 MHz to 447 MHz, the first local oscillator signal LO1 is set in the range of 978 MHz to 1337 MHz. Therefore, third mixer 146 mixes the third intermediate frequency signal with the first local oscillator signal LO1, to produce the final frequency signal. Then, switches 148 and 149a are controlled to allow the final frequency signal to pass through BPF 152 and amplifier 158. BPF 152 allows signals in the range of 118 MHz to 447 MHz to pass therethrough. The signal is then routed to an AIU 101 which supports VHF AM for additional filtering and amplification. Transpond bus 115 is not used when common transmit module 102 is programmed for use in a VHF AM system.

AIR TRAFFIC CONTROL RADAR BEACON SYSTEM (ATCRBS)

As previously described, common receive module 100 and common transmit module 102 are reprogrammable to receive and transmit, respectively, different types of signals corresponding to different types of communication, navigation and identification (CNI) functions. For example, common receive module 100 can be programmed to receive signals corresponding to an air traffic control radar beacon system (ATCRBS) and common transmit module 102 can be programmed to transmit signals corresponding to ATCRBS. The configuration of common receive module 100 for ATCRBS is more fully disclosed in related disclosure entitled "DIGITALLY PROGRAMMABLE RADIO MODULES FOR TRANSPONDER SYSTEMS", previously mentioned.

In common transmit module 102, data files for configuring FPGA 114 for ATCRBS are generally transferred from RAM 125 when ATCRBS is selected. DSP 112 only needs to receive information over system bus 109 to indicate that ATCRBS is selected before transferring configuration files to FPGA 114. As a result, the time to reconfigure FPGA 114 is reduced since data files do not have to be transferred over system bus 109.

Commands to AIU 101 requiring a short time response are processed in DSP 112 and, if necessary, reformatted in FPGA 114 and passed to AIU 101 via discrete lines. For example, transponder top or bottom antenna selection signals can be sent to AIU 101 via transmit discrete 129b. Pulse shape strobes can be sent to AIU 101 via transmit discrete 129c for synchronization of modulator pulse output with additional pulse shaping (e.g., for TACAN gaussian pulses) that could be performed in an AIU power amplifier in AIU 101. Not all of these example transmit discretes are necessarily used for every application, and the flexibility of the design permits FPGA 114 to be programmed for other interfaces, of either discrete functionality, or serial or parallel bus functionality.

FPGA 114 also generates a control signal TCTRL via tune bus 117, which includes a differential clock and a differential serial data stream, to control interface 123 of analog submodule 108. The control signal controls conversion variables of analog submodule 108. These conversion variables are parameters embedded in the DSP programs of each application.

Figure 10:
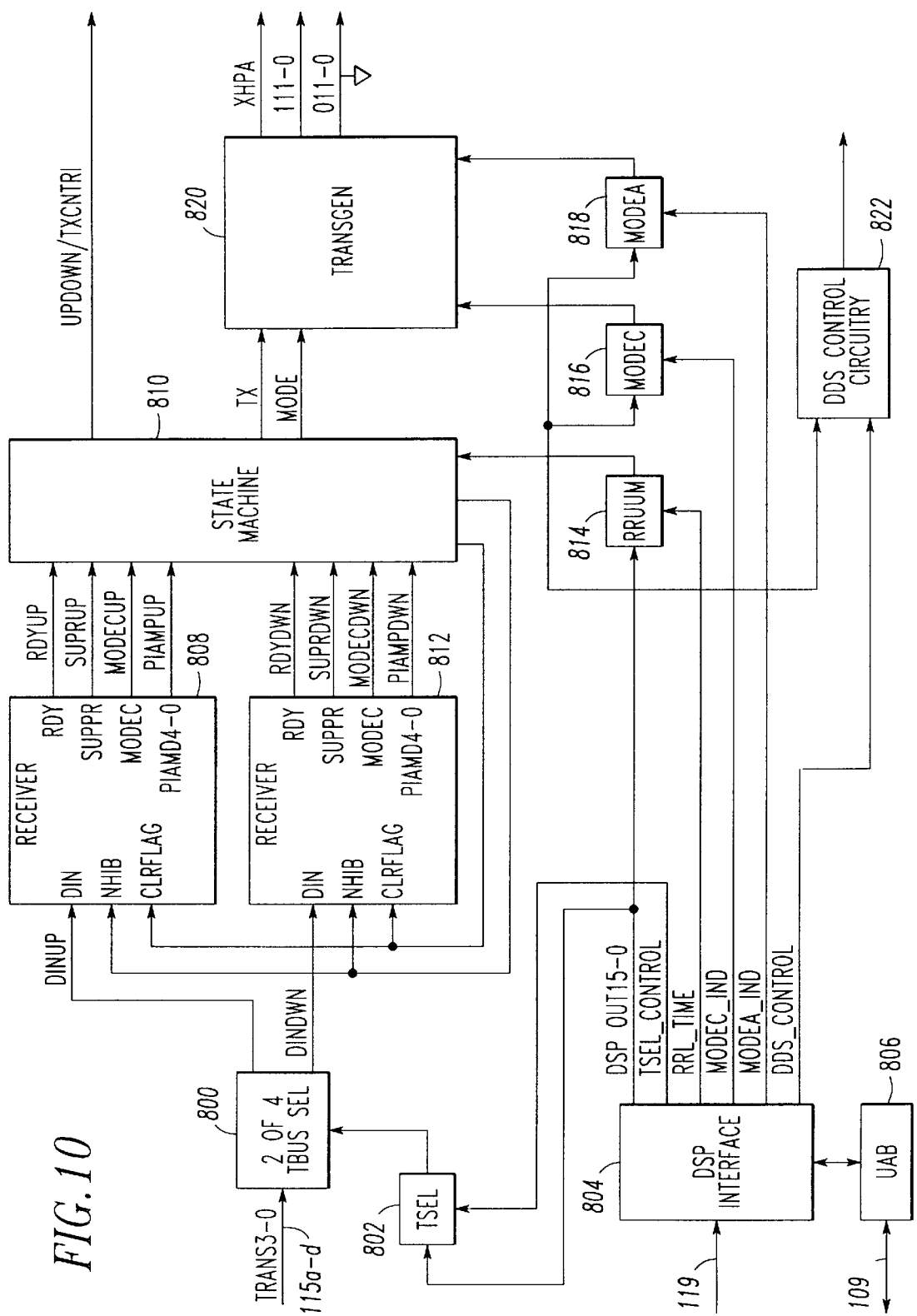
FIG. 10 is a block diagram of a portion of a common transmit module programmed for use in an air traffic control radar beacon system (ATCRBS), according to an embodiment of the present invention.

FIG. 10 is a block diagram of FPGA 114 in common transmit module 102 configured for the ATCRBS function. The FPGA 114 receives at least one eight bit serial digital data signal over transpond bus 115. FPGA 114 may receive additional eight bit serial digital data signals over additional transpond buses (not illustrated) respectfully corresponding to other common receive modules (not illustrated). Such a configuration would be used for an application such as ATCRBS where an aircraft or other apparatus has more than one receiver or receive module for receiving information such as altitude and/or an identification code.

As one such example, an aircraft may have a first antenna on the top of the aircraft and a second antenna on the bottom of the aircraft. Each antenna may pass the same information to two respective receivers. Each receiver, in this example, a respective common receive module, would perform those functions detailed above and each common receive module would supply a respective message over a respective transpond bus. A single common transmit module would then determine which signal is stronger, i.e., perform diversity processing. The common transmit module would generate a reply to the AIU that received the strongest interrogation signal.

More specifically, referring to FIG. 10, FPGA 114 is coupled to four transpond buses 115a–d which transmit respective serial messages to produce a transpond signal TRANS3-0. A selector 800 selects two of the four transpond buses 115a–d from which to receive messages. The selector 802 receives a selector signal SEL, which in this example, is four bits, indicating which of the transpond buses to select and consequently, which signals (TRANS3, TRANS2, TRANS1 or TRANS0) to receive.

The selector signal SEL is output from a selection register TSEL 802 which receives four least significant bits DSP_OUT3-0 of an output signal DSP_OUT15-0 output from a digital signal processor (DSP) interface 804. In this example, the output signal DSP_OUT15-0 is 16 bits. DSP interface 804 receives signals from DSP 112 over local bus 119. Selection register TSEL 802 is controlled by a selection control signal TSEL_CONTROL, also received from DSP interface 804.

DSP interface 804 is additionally coupled to a UART 806 which is coupled to system bus 109. UART 806 receives messages from system bus 109 and converts the messages into an understandable format and transmits messages to system bus 109 after converting the messages into an understandable format.

DSP interface 804 outputs the DSP output signal DSP_OUT15-0, which in this example is 16 bits. DSP interface 804 additionally outputs the selection control signal TSEL_CONTROL, a reply time signal RRL_TIME, a mode C indicator signal MODEC_IND, a mode A indicator signal MODEA_IND and a direct digital synthesis DDS control signal DDS_CONTROL.

DSP output signal DSP_OUT15-0 is supplied to a reply rate limiter RRLIM 814 which is controlled by reply time signal RRL_TIME. RRL 814 limits the rate at which common transmit module 102 can generate replies.

Selector 800 supplies two signals, in this example, a digital up signal DINUP representing a digital message received from a top receiver of an apparatus, such as an aircraft and a digital down signal DINDWN representing a digital message from a bottom receiver of the apparatus. DINUP is supplied to a first receiver 808 and DINDWN is supplied to a second receiver 812. Receivers 808 and 812 each convert their respective received signals into parallel signals having parallel format.

Both receivers 808 and 812 receive an inhibit signal INHIB and a clear flag signal CLRFLAG from state machine 810. The inhibit signal notifies receivers 808 and 812 not to output the parallel signals and the clear flag signal notifies receivers 808 and 812 to clear their respective buffers.

Receiver 808 determines the suppress signal SUPPR, mode signal MODEC and pulse amplitude signal P1AMP of each 8 bit digital data signal received, in this case a serial signal, as was encoded by common receive module 100 and outputs them as SUPRUP, MODECUP and P1AMPUP, respectively to state machine 810. Additionally, receiver 808 outputs a ready signal RDYUP indicating the serial digital data signal has been processed and is ready for transmission to state machine 810.

Similarly, receiver 812 determines the suppress signal SUPPR, mode signal MODEC and pulse amplitude signal P1AMP of each 8 bit serial digital data signal received, as was encoded by common receive module 100 and outputs them as SUPRDWN, MODECDWN and P1AMPDWN, respectively to state machine 810. Additionally, receiver 812 outputs a ready signal RDYDWN indicating the serial digital data signal has been processed and is ready for transmission to state machine 810.

State machine 810 determines which signal, the up signal or the down signal, is received and which is a stronger signal, based on predetermined criteria. If the signal is for suppression, the state machine will suppress the respective parallel signal in response to the respective suppress signal, SUPRUP or SUPRDWN. When one parallel signal is received, either P1AMPUP or P1AMPDWN, as indicated by RDYUP or RDYDWN, respectively, a reply by common transmit module will be to the respective transmitter unless the other parallel signal is received simultaneously.

In this example, simultaneously is set to be within 125 nanoseconds. Therefore, if the up and down parallel signals P1AMPUP and P1AMPDWN are both received within 125 nanoseconds of each other, state machine 810 will compare the parallel signals to determine which signal is stronger based on the amplitudes as indicated by amplitude signals P1AMPUP and P1AMPDWN. The reply will be to the AIU which has received the stronger interrogation signal.

State machine 810 will thus output a control signal UPDOWN\TXCNTRL which indicates to which antenna to reply. Additionally, state machine 810 outputs a transmission signal TX to indicate if a transpond generator TRANSGEN 820 should start transmitting and a mode signal MODE to indicate in which mode a transmission signal is responding.

The transpond generator of transpond generator circuitry 820 receives the TX and MODE inputs and generates an appropriate reply pulse train. The MODE signal is used to select one of two replies that were loaded into the MODEC and MODEA registers, 816 and 818. The TX signal is a real time pulse indicating that transmission should begin. The TX signal causes the data in the selected register, MODEC 816 or MODEA 818 to be sent over an I bus, I11-0. A Q bus is held at zero and the data is transmitted over the I bus to quadrature mixer 116 to be modulated with a carrier generated by numerically controlled oscillator 118 to produce a modulated carrier signal. This modulated carrier signal is the reply required by the ATCRBS system in a digital form at a lower carrier frequency.

The XHPA signal is a control signal for the high power amplifier resident in the antenna interface unit. DDS control circuitry 822 in the FPGA 114 is used to set a desired carrier frequency, $f_0$ in numerically controlled oscillator 118. In ATCRBS, the phase and frequency modulation control available on numerically controlled oscillator 118 are unused.

The modulated signal generated by quadrature mixer 116 is transferred to the DAC and an analog signal is generated. The analog signal generated is passed on to analog submodule 108 for, in this example, conversion to a required carrier frequency. The first local oscillator signal (LO1) is a tunable local oscillator signal and is selected from Table III, above, in accordance with a desired RF output frequency, which is, for example, 1090 MHz for the standard ATCRBS and IFF response.

Moreover, referring to FIGS. 2 and 3, the frequency range of the first local oscillator signal LO1 and the oscillator signal selected by switch 134 is readily determinable from Table III, above, and FIG. 3. For standard ATCRBS, when the desired RF output is in the range of 824 MHz to 1150 MHz, as illustrated by Table III, switch 134 selects the third local oscillator signal LO3 (approximately 480 MHz) so that the third intermediate frequency signal output by second mixer 136 has a frequency of approximately 410 MHz. Additionally, switch 204 (see FIG. 6) is selected and divider 206 (see FIG. 6) is turned off such that divider 202 (see FIG. 6) is selected and the first local oscillator signal LO1 is tuned to be in the range of 1234 MHz to 1560 MHz. Specifically for standard ATCRBS, the DPLL is tuned to approximately 3000 MHz and the LO1 output is 1500 MHz. Therefore, various switches in the analog submodule 108 are controlled so that appropriate local oscillator signals and appropriate BPFs are selected to produce a required final converted signal.

An Air Traffic Control Radar Beacon System (ATCRBS) transmits signals of approximately 1090 MHz. The signal flow through analog submodule 108 when common transmit module 102 is programmed to transmit ATCRBS signals is best understood by referring to FIGS. 2 and 3. Referring now to FIGS. 2 and 3, the first analog intermediate frequency signal produced by digital to analog converter 120 in digital submodule 110 is centered at approximately 10 MHz. Switches 127a and 127b are controlled to allow the first analog intermediate frequency signal to pass through BPF 128. First mixer 130 receives the filtered first analog intermediate frequency signal and the fourth local oscillator signal LO4 (60 MHz), and produces a corresponding second analog intermediate frequency signal centered at approximately 70 MHz. The second analog intermediate frequency signal passes through BPF 132, amplifier 170a and is received by second mixer 136. Since an ATCRBS transmission signal is at approximately 1090 MHz, Table III, above, indicates that switch 134 selects LO3 at 480 MHz. Therefore, second mixer 136 mixes the second analog intermediate frequency signal with LO3, in accordance with Table III, to produce a third analog intermediate frequency signal. As a result, the third analog intermediate frequency signal is at approximately 410 MHz.

The third analog intermediate frequency signal is passed through BPF 142 by appropriately controlling switches 138 and 140. As previously discussed, BPF 142 passes signals in the approximate range of 405–415 MHz. From BPF 142, the signal passes through amplifier 170b and is received by third mixer 146. Third mixer 146 also receives LO1. As indicated by Table III, above, for ATCRBS transmission signals at approximately 1090 MHz, LO1 is controlled to be approximately 1500 MHz by selecting the division ratio equal to "two" (see frequency divider circuit 202 in FIG. 6). Therefore, third mixer 146 mixes the third analog intermediate frequency signal at approximately 410 MHz with LO1 which is approximately 1500 MHz, to produce a final converted signal of approximately 1090 MHz. Switches 148, 149b and 151 are then controlled to route the final converted signal through BPF 154a (passing signals in the range of 824–1150 MHz), in accordance with a specific frequency of the final converted signal.

The final converted signal then passes through switch 151, amplifiers 160b and 160a, and is routed to an antenna interface unit.

By the preceding structure, an AIR TRAFFIC CONTROL RADAR BEACON SYSTEM can be achieved which performs efficiently and accurately within a programmable common receive module and a programmable common transmit module.

A common transmit module according to the above embodiments of the present invention has the following advantages: (1) Generally, a relatively low speed (approx. 1 MB/sec) serial bit stream input is required and an approximately 2–2000 MHz RF output is produced; (2) Common transmit module 102 is programmable to modulate and transmit many narrowband and wideband communication, navigation and identification (CNI) radio functions—For example, see FIG. 5, excluding receive-only functions such as ILS; (3) Digital submodule 110 comprises of a digital modulator, FPGAs, DSPs plus memory for a variety of signal processing functions; (4) All high speed parallel sampling rate synchronous control busses are on the same board in the same module; (5) Analog submodule 108 comprises switchable analog cleanup filters for DAC; (6) The first analog IF signal is a subharmonic of DAC sample rate (for low out-of-channel spurious)—Moreover, there is an alternate embodiment of first IF offset from subharmonic of DAC sample rate plus cleanup filtering for additional reduction of inchannel and out-of-channel spurious; (7) Common transmit module 102 is functionally designed for minimal hardware (albeit higher levels of integration are possible to reduce size even further); (8) Common transmit module 102 has a combination of digital smoothing/filtering and analog filtering for optimum spurious emission performance for a wide range of radio functions with minimal hardware; (9) Common transmit module 102 has highly linear signal output (to eventual power amplifier, if needed) for excellent spectral and temporal purity for all amplitude, phase and frequency modulated waveforms; (10) Common transmit module 102 permits open architecture for power amplification; (11) Common transmit module 102 has a straight through path from applique; (12) Common transmit module 102 can be depopulated to reduce overhead for some applications—For example, L-band can be removed for some portable radios; (13) Common transmit module 102 uses "linearity tailoring" versus radio function/frequency band combinations for minimum power dissipation—For example, since L-band waveforms have no amplitude dependence, the final stage amplifier can be lowered to a fraction of a watt.

Examples of digital processing internal to common transmit module 102 include control of the RF/IF frequency conversion circuits (transmit frequency, filter bandwidths, etc.), management/configuration of the digital I/O, interpolation or smoothing, digitized phase, frequency and amplitude waveform generation, vector modulation, antenna diversity decision making for transponder functions, and power amplifier control. Such digital processing is typically performed by DSP 112.

In addition, the digital circuitry of digital submodule 110 configures common transmit module 102 as directed by a communication, navigation and identification (CNI) controller, performs module BIT (built-in test) and report status to the communication, navigation and identification (CNI) controller, and possibly performs synchronization for frequency hopping. Common transmit module 102 may perform channel coding, message processing including reformatting for transmission, network formatting, interleaving, and formatting for various terminals (such as control terminals), although these functions may be performed prior to the signal being received by common transmit module 102 and depending on the processing power implemented. Functions of analog submodule 108 include frequency tuning and frequency hopping.

Logistics, built-in-test/fault isolation (BIT/FIT) and maintenance are facilitated because common transmit module 102 is housed in a single plug-in unit that inputs low-speed serial digital data and outputs RF. Also, all the high-speed processing and major parallel interconnects are completely contained inside common transmit module 102 to simplify the backplane, and to reduce EMI to remaining portions of the system. Common transmit module 102 also reduces internal EMI between the analog submodule 108 and digital submodule 110.

Common transmit module 102 services communication, navigation and identification (CNI) functions over a correspondingly wide frequency band, and is required for functions that require transmission such as voice or data communication, transponding or interrogating. Functions that are receive-only (such as, for example, ILS, VOR and GPS) would not, of course, employ a common transmit module. The tunable portion of an associated common receive module 104 synthesizer can be used to tune the common transmit module for half duplex operation. Thus, synthesizer overhead can be reduce for small applications.

It may be necessary to add processing power to common transmit module 102 to perform relatively high-speed multibit processing (such as LPI/LPD) on the transmit waveform before modulation. In this case, either an applique module or a special-purpose common transmit module can be used to perform such processing. To house the additional components, this special-purpose transmit module would generally be larger than a common transmit module. However, even a special-purpose transmit module would possess the analog and digital circuits that are found within a common transmit module. Also, as the size and cost of digital processing decreases, it may be practical to house the additional processing within common transmit modules, with acceptable size and cost overhead.

Various frequencies and bandwidths are described herein. However, the present invention is not intended to be limited to these specific frequencies and a common transmit module can be used to transmit over many different frequencies by changing the various oscillator frequencies and bandpass filter bandwidths.

Although a few preferred embodiments of the invention have been shown and described, it will be appreciated by those skilled in the art that changes may be made in these embodiments, without departing from the principles and the spirit of the invention, the scope of which is defined in the claims and their equivalents.

What is claimed is:

1. A transmit module which is programmed for a specific type of radio function having a corresponding frequency and which is reprogrammable to transmit radio signals for different types of radio functions, the transmit module comprising:

a self-contained digital submodule for receiving a bit stream representing information to be transmitted and for producing a modulated analog intermediate frequency signal; and a self-contained analog submodule, connected to said self-contained digital submodule, for receiving the modulated analog intermediate frequency signal and converting the modulated analog intermediate frequency signal into the frequency corresponding to the specific type of radio function, said self-contained digital submodule including;
   a reconfigurable format unit reconfigurable for receiving the information to be transmitted and producing output signals for different types of radio functions,
   a modulator, coupled to said reconfigurable format unit, for receiving the output signals of said reconfigurable format unit and for producing a modulated digital intermediate frequency signal, the modulated digital intermediate frequency signal being converted into the modulated analog intermediate frequency signal,
   a sequential/parallel instruction processor for receiving the information to be transmitted and producing an in-phase signal, a quadrature signal, a phase signal and a frequency signal in accordance with the specific type of radio function programmed in the transmit module, said reconfigurable format unit being coupled to said sequential/parallel instruction processor for receiving the information to be transmitted from said sequential/parallel instruction processor in the form of the in-phase, quadrature, phase and frequency signals and for respectively producing corresponding formatted in-phase, quadrature phase, and frequency signals; and wherein said modulator includes
   a numerically controlled oscillator, coupled to said reconfigurable format unit and responsive to the formatted frequency signal and the formatted phase signal produced by said reconfigurable format unit, for producing a digital oscillation signal, and a quadrature mixer, coupled to said reconfigurable format unit and responsive to the formatted in-phase signal and the formatted quadrature signal and coupled to said numerically controlled oscillator and responsive to the digital oscillation signal, for producing the modulated digital intermediate frequency signal.

2. The transmit module as in claim 1, wherein said self-contained digital submodule further comprises a programmable digital filter unit for filtering digital signals produced by said sequential/parallel instruction processor and said reconfigurable format unit.

3. The transmit module as in claim 1, wherein said self-contained digital submodule further comprises a memory for storing a plurality of application programs which respectively correspond to different types of radio functions, said sequential/parallel instruction processor running a respective program of the plurality of application programs stored in said memory for causing the transmit module to transmit signals in accordance with the type of radio function corresponding to the respective program.

4. The transmit module as in claim 3, wherein said memory comprises at least one of a RAM memory and a flash memory.

5. The transmit module as in claim 1, wherein said self-contained analog submodule comprises a tunable local oscillator, frequency tuning being proportioned between said numerically controlled oscillator of said self-contained digital submodule and said tunable local oscillator of said self-contained analog submodule.

6. The transmit module as in claim 5, wherein said self-contained digital submodule sends control signals to said self-contained analog submodule to control frequency tuning in said self-contained analog submodule.

7. The transmit module as in claim 1, wherein said self-contained digital submodule further comprises means for interpolating the received bit stream.

8. The transmit module as in claim 7, wherein said sequential/parallel instruction processor includes said means for interpolating.

9. A transmit module which is programmed for a specific type of radio function having a corresponding frequency and which is reprogrammable to transmit radio signals for different types of radio functions, the transmit module comprising:
 a digital submodule for receiving a bit stream representing information to be transmitted and for producing a modulated analog intermediate frequency signal; and
 an analog submodule, connected to said digital submodule, for receiving the modulated analog intermediate frequency signal and converting the modulated analog intermediate frequency signal into the frequency corresponding to the specific type of radio function,
 said analog submodule including;
  tunable local oscillator for producing a tunable local oscillation signal,
  fixed local oscillators for respectively producing corresponding fixed local oscillation signals, and
  a mixing unit coupled to said digital submodule for receiving the modulated analog intermediate frequency signal, coupled to said tunable local oscillator for receiving the tunable local oscillation signal, and coupled to said fixed local oscillators for receiving the fixed local oscillation signals, selectively mixing the fixed local oscillation signals with the modulated analog intermediate frequency signal to produce a non-final intermediate frequency signal, and mixing the non-final intermediate frequency signal with the tunable local oscillation signal to produce a final converted signal for transmission at the frequency corresponding to the specific type of radio function.

10. The transmit module as in claim 9, wherein said digital submodule is electrically isolated from said analog submodule.

11. The transmit module as in claim 9, wherein said tunable local oscillator and said fixed local oscillators comprise a synthesizer for producing the tunable local oscillation signal and the fixed local oscillation signals.

12. The transmit module as in claim 11, wherein said synthesizer comprises a double phase-locked loop synthesizer.

13. The transmit module as in claim 9, wherein the modulated intermediate frequency signal represents a first intermediate frequency signal and said mixing unit of said analog submodule comprises:
 a first mixer for mixing the first intermediate frequency signal with a first fixed local oscillation signal, to produce a second intermediate frequency signal;
 a second mixer, selectively receiving one of a second local oscillation signal and a third local oscillation signal, for mixing the second intermediate frequency signal with the received one of the second local oscillation signal and the third local oscillation signal, to produce a third intermediate frequency signal; and
 a third mixer for mixing the third intermediate frequency signal with the tunable local oscillation signal to produce the final converted signal.

14. The transmit module as in claim 13, wherein said analog submodule further comprises a filtering mechanism for filtering the third intermediate frequency signal before the third intermediate frequency signal is received by said third mixer, said filtering mechanism comprising:
 a first filter having a first bandpass range;
 a second filter having a second bandpass range; and
 a switch mechanism, connected to said first filter, said second filter and said third mixer, for switching the third intermediate frequency signal to one of said first filter and said second filter and for providing the filtered third intermediate frequency signal to said third mixer.

15. The transmit module as in claim 9, wherein said analog submodule further comprises a filtering mechanism for filtering the final converted signal before the final converted signal is transmitted, said filtering mechanism comprising:
 a first filter having a first bandpass range;
 a second filter having a second bandpass range; and
 a switching mechanism, connected to said first filter and said second filter, for switching the final converted signal to one of said first filter and said second filter before the final converted signal is transmitted.

16. A transmit module which is programmed for a specific type of radio function having a corresponding frequency and which is reprogrammable to transmit radio signals for different types of radio functions, the transmit module comprising:
 a digital submodule for receiving a bit stream representing information to be transmitted and for producing a modulated analog intermediate frequency signal, the digital submodule including;
  a sequential/parallel instruction processor for receiving the information to be transmitted and for producing an in-phase signal, a quadrature signal, a phase signal and a frequency signal in accordance with the specific type of radio function programmed in the transmit modules;
  a reconfigurable format unit, reconfigurable to produce output signals for different types of radio functions and being coupled to said sequential/parallel instruction processor, for receiving the information to be transmitted from said sequential/parallel instruction processor in the form of the in-phase, quadrature, phase and frequency signals and for respectively producing corresponding formatted in-phase, quadrature, phase and frequency signals;
  a numerically controlled oscillator, coupled to said reconfigurable format unit and responsive to the formatted frequency signal and the formatted phase signal, for producing a digital oscillation signal; and
  a quadrature mixer, coupled to said reconfigurable format unit and responsive to the formatted in-phase signal and the formatted quadrature signal and coupled to said numerically controlled oscillator and responsive to the digital oscillation signal, for producing the modulated analog intermediate frequency signal; and
 an analog submodule, coupled to said digital submodule, for receiving the modulated analog intermediate frequency signal and for converting the modulated analog intermediate frequency signal to the frequency corresponding to the specific type of radio function.

17. A digital module which is self-contained and programmed for a specific type of radio function having a corresponding frequency, the digital module receiving a bit stream representing information to be transmitted and producing a modulated oscillation signal, the digital module comprising:

a sequential/parallel instruction processor for receiving the information to be transmitted and for producing an in-phase signal, a quadrature signal, a phase signal and a frequency signal in accordance with the specific type of radio function programmed in the digital module;

a reconfigurable format unit, reconfigurable to produce output signals for different types of radio functions and being coupled to said sequential/parallel instruction processor, for receiving the information to be transmitted from the sequential/parallel instruction processor in the form of the in-phase, quadrature, phase and frequency signals and for producing output signals in accordance with the specific type of radio function programmed in the transmit module; and a modulator, coupled to said reconfigurable format unit, for receiving the output signals of said reconfigurable format unit and producing the modulated oscillation signal.

18. The digital module as in claim 17, wherein the digital module is reprogrammable to produce modulated oscillation signals at different oscillation frequencies modulated with combinations of amplitude, phase and frequency signals.

19. The digital module as in claim 17, further comprising a programmable digital filter unit for filtering digital signals produced by at least one of said sequential/parallel instruction processor, said reconfigurable format unit and said modulator.

20. The digital module as in claim 17, wherein the digital module is reprogrammable to transmit radio signals for communication, navigation and identification radio functions.

21. The digital module as in claim 17, wherein the digital module is reprogrammable to transmit different waveforms corresponding to different communication functions.

22. The digital module as in claim 17, wherein the digital module is reprogrammable to transmit different waveforms corresponding to different navigation functions.

23. The digital module as in claim 17, wherein the digital module is reprogrammable to transmit different waveforms corresponding to different identification functions.

24. The digital module as in claim 17, further comprising a memory for storing a plurality of application programs which respectively correspond to different types of radio functions, the digital module being reprogrammable to transmit radio signals for a respective type of radio function by running the corresponding application program.

25. The digital module as in claim 17, wherein the digital module is programmable to transmit radio signals for different types of radio functions by downloading application programs into the digital module from an external memory.

26. The digital module as in claim 24, wherein said memory comprises at least one of a RAM memory and a flash memory.

27. The digital module as in claim 17, wherein said reconfigurable format unit produces a formatted in-phase signal, a formatted quadrature signal, a formatted phase signal and a formatted frequency signal in accordance with the specific type of radio function programmed therein, said modulator comprising:

a numerically controlled oscillator, coupled to said reconfigurable format unit and responsive to the formatted frequency signal and the formatted phase signal produced by said reconfigurable format unit, for producing a digital oscillation signal; and a quadrature mixer, coupled to said reconfigurable format unit and responsive to the formatted in-phase signal and the formatted quadrature signal and coupled to said numerically controlled oscillator and responsive to the digital oscillation signal, for producing the modulated oscillation signal.

28. The digital module as in claim 27, wherein the modulated oscillation signal produced by said quadrature mixer is in digital form, the digital module further comprising a digital to analog converter for receiving the modulated oscillation signal and for converting the modulated oscillation signal to an analog signal.

29. The digital module as in claim 17, wherein said reconfigurable format unit is a field programmable gate array.

30. The digital module as in claim 17, further comprising at least one of:

a system bus for connecting the digital module to an external controller which is operable to reprogram the digital module, a transmit bus for connecting the digital module to an antenna interface unit, a transpond bus for connecting the digital module to a receive module, and an applique bus for connecting the digital module to an applique module.

31. A digital module which receives a serial bit stream representing information to be transmitted and which produces a modulated oscillation signal, the digital module comprising:

a reconfigurable format unit reprogrammable for transmitting radio signals of different types of radio functions, said reconfigurable format unit producing an in-phase signal, a quadrature signal, a phase signal and a frequency signal in accordance with the specific type of radio function programmed in the digital module;

a numerically controlled oscillator, coupled to said reconfigurable format unit and responsive to the frequency signal and the phase signal produced by said reconfigurable format unit, for producing a digital oscillation signal;

a quadrature mixer, coupled to said reconfigurable format unit and responsive to the in-phase signal and the quadrature signal and coupled to said numerically controlled oscillator and responsive to the digital oscillation signal, for producing the modulated oscillation signal, the modulated oscillation signal being a digital signal; and a digital to analog converter, coupled to said quadrature mixer, for receiving the modulated oscillation signal and for converting the modulated oscillation signal to an analog signal.

32. An analog module which receives a modulated oscillation signal and which produces a final converted radio frequency signal for a radio function having a corresponding frequency, comprising:

a tunable local oscillator for producing a tunable local oscillation signal;

fixed local oscillators for respectively producing corresponding fixed local oscillation signals; and a mixing unit for receiving the modulated oscillation signal, said mixing unit being coupled to said tunable local oscillator for receiving the tunable local oscillation signal and being coupled to said fixed local oscillators for receiving the fixed local oscillation signals, selectively mixing the fixed local oscillation signals with the modulated oscillation signal to produce a non-final intermediate frequency signal, and mixing the non-final intermediate frequency signal with the tunable local oscillation signal to produce the final converted radio frequency signal for transmission at the frequency corresponding to the type of radio function.

33. The analog module as in claim 32, wherein said tunable local oscillator and said fixed local oscillators comprise a synthesizer for producing the tunable local oscillation signal and the fixed local oscillation signals.

34. The analog module as in claim 33, wherein said synthesizer comprises a double phase-locked loop synthesizer which uses preset voltages in each loop to increase tuning speed.

35. The analog module as in claim 33, wherein said synthesizer comprises a double phase-locked loop synthesizer.

36. The analog module as in claim 32, wherein the modulated oscillation signal represents a first intermediate frequency signal and said mixing unit comprises:
    a first mixer for mixing the first intermediate frequency signal with a first fixed local oscillation signal to produce a second intermediate frequency signal;
    a second mixer for selectively receiving one of a second local oscillation signal and a third local oscillation signal and for mixing the second intermediate frequency signal with the received one of the second local oscillation signal and the third local oscillation signal to produce a third intermediate frequency signal; and
    a third mixer, coupled to said tunable local oscillator, for mixing the third intermediate frequency signal with the tunable local oscillation signal to produce the final converted radio frequency signal.

37. The analog module as in claim 36, further comprising a filtering mechanism for filtering the third intermediate frequency signal before the third intermediate frequency signal is received by said third mixer, said filtering mechanism comprising:
    a first filter having a first bandpass range;
    a second filter having a second bandpass range; and
    a switching mechanism, coupled to said first filter and said second filter, for switching the third intermediate frequency signal to one of said first filter and said second filter and for providing the filtered third intermediate frequency signal to said third mixer.

38. The analog module as in claim 36, further comprising a filtering mechanism for filtering the final converted signal before the final converted signal is transmitted, said filtering mechanism comprising:
    a first filter having a first bandpass range;
    a second filter having a second bandpass range; and
    a switching mechanism, coupled to said first filter and said second filter, for switching the final converted radio frequency signal to one of said first filter and said second filter before the final converted radio frequency signal is transmitted.

39. A programmable transmit module comprising:
    a self-contained digital submodule, coupled to a bit stream representing information to be transmitted and programmably reconfigurable for operation in each of different radio modes, for selectively digitally processing the bit stream to generate a digital modulated signal for the different radio modes and converting the digital modulated signal into an analog modulated signal;
    a self-contained analog submodule, having an intermediate frequency, coupled to said self-contained digital submodule and programmably reconfigurable for operation in each of the different radio modes, for selectively frequency translating the analog modulated signal into an RF transmission signal;
    wherein said self-contained analog submodule further comprises,
        frequency synthesizing means for selectively generating local oscillation signals for each of the different radio modes in accordance with control signals generated by said self-contained digital submodule, mixing means for mixing the analog modulated signal with the local oscillation signals, a plurality of filter banks each selectively switchable to provide respective filtering for each of the different radio modes in accordance with the control signals generated by said self-contained digital submodule, and
        a first of said plurality of filter banks being coupled to an output of said mixing means for selectively providing the RF transmission signal as an output of said self-contained analog submodule; and
    wherein said self-contained digital submodule generates control signals for respectively reconfiguring said self-contained analog submodule for operation in each of the different radio modes.

40. The programmable transmit module of claim 39, wherein said frequency synthesizing means comprises a tunable local oscillator and a fixed local oscillator for respectively generating a tunable local oscillation signal and fixed local oscillation signals as the local oscillation signals.

41. The programmable transmit module of claim 40, wherein said tunable local oscillator comprises a double phase-locked loop synthesizer which uses preset voltages in each loop to increase tuning speed.

42. The programmable transmit module of claim 39, wherein said mixing means comprises a plurality of mixers for mixing the analog modulated signal in respective different stages with respective different ones of the local oscillation signals.

43. The programmable transmit module of claim 39, wherein said self-contained digital submodule comprises:
    processing means, coupled to the bit stream, for generating an in-phase signal, a quadrature signal, a phase signal and a frequency signal from the bit stream in accordance with the selected one of the different radio modes;
    a reconfigurable format unit, coupled to said processing means, for formatting the in-phase signal, the quadrature signal, the phase signal and the frequency signal in accordance with the selected one of the different radio modes;
    a numerically controlled oscillator, coupled to said reconfigurable format unit and responsive to the formatted phase signal and the formatted frequency signal, for producing a digital oscillation signal;
    a quadrature mixer, coupled to said reconfigurable format unit and said numerically controlled oscillator, for mixing the formatted in-phase signal and the formatted quadrature signal with the digital oscillation signal; and
    a digital/analog converter for analog converting an output of said quadrature mixer into the analog modulated signal.

44. The programmable transmit module of claim 39, wherein said self-contained digital submodule is programmably reconfigurable to provide the digital modulated signal modulated with combinations of amplitude, phase and frequency signals.

* * * * *